US010566045B2

(12) United States Patent
Lee

(10) Patent No.: US 10,566,045 B2
(45) Date of Patent: *Feb. 18, 2020

(54) ELECTRONIC DEVICE INCLUDES RESISTIVE STORAGE CELLS AND REFERENCE RESISTANCE TRANSISTOR, A RESISTANCE ADJUSTMENT BLOCK TO ADJUST THE RESISTANCE VALUE DEPENDING ON A TEMPERATURE AND A DATA SENSING BLOCK TO SENSE THE RESISTIVE VALUE OF THE RESISTIVE STORAGE CELL AND THE REFERENCE TRANSISTOR RESISTANCE VALUE

(71) Applicant: SK hynix Inc., Icheon-Si (KR)

(72) Inventor: Ki-Won Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 25 days.

This patent is subject to a terminal disclaimer.

(21) Appl. No.: 15/679,045

(22) Filed: Aug. 16, 2017

(65) Prior Publication Data

US 2018/0114562 A1 Apr. 26, 2018

(30) Foreign Application Priority Data

Oct. 24, 2016 (KR) .................. 10-2016-0138268

(51) Int. Cl.
*G11C 13/04* (2006.01)
*G11C 11/4091* (2006.01)
(Continued)

(52) U.S. Cl.
CPC .......... *G11C 11/4091* (2013.01); *G11C 7/14* (2013.01); *G11C 11/165* (2013.01); *H01L 27/1052* (2013.01)

(58) Field of Classification Search
CPC ..... G11C 11/4091; G11C 11/165; G11C 7/04; G11C 7/14; G11C 7/062
(Continued)

(56) References Cited

U.S. PATENT DOCUMENTS 9,859,000 B1 * 1/2018 Lin ...................... G11C 13/004
10,269,404 B2 * 4/2019 Fujita .................. G11C 11/1673
(Continued)

FOREIGN PATENT DOCUMENTS

KR 10-0944058 2/2010
KR 10-2015-0116072 10/2015

*Primary Examiner* — Connie C Yoha
(74) *Attorney, Agent, or Firm* — Perkins Coie LLP

(57) ABSTRACT

An electronic device includes a semiconductor memory. The semiconductor memory includes one or more resistive storage cells each structured to exhibit different resistance values for storing data; at least one reference resistance transistor to produce a reference resistance value; a reference resistance adjustment block coupled to the at least one reference resistance transistor and structured to supply a signal to the at least one reference resistance transistor that can cause an adjustment in the resistance value of the reference resistance transistor; and a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell.

20 Claims, 15 Drawing Sheets

(51) Int. Cl.
*G11C 7/14* (2006.01)
*G11C 11/16* (2006.01)
*H01L 27/105* (2006.01)

(58) Field of Classification Search
USPC .............................. 365/208, 148, 210, 211
See application file for complete search history.

(56) References Cited

U.S. PATENT DOCUMENTS

| | | | |
|---|---|---|---|
| 2004/0008543 A1* | 1/2004 | Kato | G11C 7/062 |
| | | | 365/189.15 |
| 2008/0291969 A1* | 11/2008 | Chu | G11C 7/04 |
| | | | 374/178 |
| 2009/0086534 A1* | 4/2009 | DeBrosse | G11C 7/062 |
| | | | 365/163 |
| 2014/0244931 A1* | 8/2014 | Kim | G11C 13/0069 |
| | | | 711/118 |
| 2016/0078915 A1* | 3/2016 | Katayama | G11C 7/065 |
| | | | 365/158 |
| 2017/0179961 A1* | 6/2017 | Itasaka | H03B 5/362 |
| 2018/0101190 A1* | 4/2018 | Lee | G05F 3/30 |
| 2018/0122462 A1* | 5/2018 | Lee | G11C 11/1673 |

\* cited by examiner

ELECTRONIC DEVICE INCLUDES RESISTIVE STORAGE CELLS AND REFERENCE RESISTANCE TRANSISTOR, A RESISTANCE ADJUSTMENT BLOCK TO ADJUST THE RESISTANCE VALUE DEPENDING ON A TEMPERATURE AND A DATA SENSING BLOCK TO SENSE THE RESISTIVE VALUE OF THE RESISTIVE STORAGE CELL AND THE REFERENCE TRANSISTOR RESISTANCE VALUE

CROSS-REFERENCE TO RELATED APPLICATION

This patent document claims priority of Korean Patent Application No. 10-2016-0138268, entitled "ELECTRONIC DEVICE" and filed on Oct. 24, 2016, which is incorporated herein by reference in its entirety.

TECHNICAL FIELD

This patent document relates to memory circuits or devices and their applications in electronic devices or systems.

DISCUSSION OF THE RELATED ART

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which controls the resistance value of a transistor element used as a reference resistance element by using a source voltage such that a reference resistance value as a reference for data sensing is adjusted precisely depending on a temperature.

In one aspect, an electronic device may include a semiconductor memory, the semiconductor memory including: one or more resistive storage cells each structured to exhibit different resistance values for storing data; at least one reference resistance transistor to produce a reference resistance value; a reference resistance adjustment block coupled to the at least one reference resistance transistor and structured to supply a signal to the at least one reference resistance transistor that can cause an adjustment in the resistance value of the reference resistance transistor; and a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell.

Implementations of the above electronic device may include one or more the following.

The data sensing block may include first and second input terminals and may be structured to compare a read current flowing through the first input terminal and the selected resistive storage cell with a reference current flowing through the second input terminal and the reference resistance transistor. The signal supplied by the reference resistance adjustment block includes a bias voltage that is applied to a gate of the reference resistance transistor. A bias voltage which is applied to a gate of the reference resistance transistor may be fixed. The signal supplied by the reference resistance adjustment block may include a source voltage provided to a source of the reference resistance transistor. The reference resistance adjustment block may be structured to adjust the source voltage depending on a temperature and may include: a voltage generation unit structured to generate a temperature-dependent voltage that is adjusted depending on a temperature; and a trimming unit coupled to the voltage generation unit to receive the temperature-dependent voltage and operable to generate the source voltage by dividing the temperature-dependent voltage with a division ratio based on voltage adjustment codes. The reference resistance adjustment block may include: a first voltage generation unit operable to generate the source voltage which is adjusted to a first slope depending on a temperature in a first temperature period; a second voltage generation unit operable to generate the source voltage which is adjusted to a second slope depending on a temperature in a second temperature period; and a temperature sensing unit coupled to the first and second voltage generation units to activate the first voltage generation unit in the first temperature period, and to activate the second voltage generation unit in the second temperature period.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In one aspect, an electronic device may include a semiconductor memory, the semiconductor memory including: a plurality of bit lines and a plurality of source lines; a plurality of resistive storage cells coupled between a corresponding bit line and a corresponding source line among the plurality of bit lines and the plurality of source lines; a plurality of reference bit lines and a plurality of reference source lines; a plurality of reference resistance transistors coupled between a corresponding reference bit line and a corresponding reference source line among the plurality of reference bit lines and the plurality of reference source lines; a plurality of data sensing blocks coupled to the plurality of reference resistance transistors and the plurality of resistive storage cells and operable to compare a read current flowing through a corresponding bit line among the plurality of bit lines with a reference current flowing through a corresponding reference bit line among the plurality of reference bit lines, and sensing data of a resistive storage cell selected among a plurality of resistive storage cells coupled to the corresponding bit line; and a reference resistance adjustment block coupled to the plurality of reference resistance transistors and structured to supply respective signals to the plurality of reference resistance transistors that can cause an adjustment in the resistance values of the reference resistance transistors, respectively.

Implementations of the above electronic device may include one or more the following.

The plurality of data sensing blocks may include first and second input terminals, and the semiconductor memory may further include: a plurality of first and second transistors coupled in series between the first input terminals of the data sensing blocks and the bit lines, and operable to be turned on or off in response to a read enable signal and a clamp signal, respectively; and a plurality of third and fourth transistors coupled in series between the second input terminals of the data sensing blocks and the reference bit lines, and operable to be turned on or off in response to the read enable signal and the clamp signal, respectively. A signal supplied by the reference resistance adjustment block includes a bias voltage that is applied to a gate of a reference resistor transistor within the plurality of reference resistance transistors. A bias voltage, which is applied to a gate of a reference resistance transistor within the plurality of reference resistance transistors, may be fixed. A signal supplied by the reference resistance adjustment block may include a source voltage provided to a source of a reference resistance transistor within the plurality of reference resistance transistors. The reference resistance adjustment block may be structured to adjust the source voltage at a reference resistance transistor depending on a temperature and may include: a voltage generation unit structured to generate a temperature-dependent voltage of which level is adjusted depending on a temperature; and a trimming unit coupled to the voltage generation unit to receive the temperature-dependent voltage and operable to generate the source voltage by dividing the temperature-dependent voltage with a division ratio that is based on voltage adjustment codes. The reference resistance adjustment block may include: a first voltage generation unit structured to generate the source voltage in a first temperature period, the source voltage adjusted based on a first relationship between a change of the source voltage and a temperature; a second voltage generation unit structured to generate the source voltage in a second temperature period, the source voltage adjusted based on a second relationship between a change of the source voltage and a temperature; and a temperature sensing unit coupled to the first and second voltage generation units to activate the first voltage generation unit in the first temperature period, and to activate the second voltage generation unit in the second temperature period. Each resistive storage cell may include: a selection element; and a variable resistance element structured to be operable to exhibit different resistance values that represent different data stored in the resistive storage cell. The variable resistance element may include a metal oxide or a structure in which a tunnel barrier layer is interposed between two ferromagnetic layers.

In one aspect, an electronic device may include a semiconductor memory, the semiconductor memory including: a storage cell including a variable resistance element structured to exhibit different resistance states of different resistance values for representing different data for data storage; a data sensing block coupled to the storage cell and including a first terminal and a second terminal, the data sensing block structured to compare a first current flowing through the first terminal with a second current flowing through the second terminal and provide an output data based the comparison; and a reference resistance element coupled to the second terminal of the data sensing block and structured to receive a temperature-dependent source voltage that is based on an operating temperature of the semiconductor memory.

Implementations of the above electronic device may include one or more the following.

The reference resistance element may have a gate terminal supplied with a fixed bias voltage. The electronic device may further include: a reference resistance adjustment block coupled to the reference resistance element and structured to provide the source voltage to the reference resistance element. The reference resistance adjustment block may include: a voltage generation unit for structured to generate a temperature-dependent voltage that is adjusted depending on a temperature; and a trimming unit coupled to the voltage generation unit to receive the temperature-dependent voltage and operable to generate the source voltage. The reference resistance element may have a constant resistance value not susceptible to temperature change. The variable resistance element may include a metal oxide or a structure in which a tunnel barrier layer is interposed between two ferromagnetic layers.

These and other aspects, implementations and associated advantages are described in greater detail in the drawings, the description and the claims.

DETAILED DESCRIPTION

Various examples and implementations of the disclosed technology are described below in detail with reference to the accompanying drawings.

A semiconductor memory device in accordance with implementations of the disclosed technology may include a variable resistance element that exhibits a variable resistance characteristic that allows for representing different digital bits or states in accordance with different resistance values of the variable resistance element. In implementations, such a variable resistance element may include a single layer or a multi-layer that exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO) or a cobalt oxide (CoO), and/or a perovskite material such as a strontium titanium oxide (STO: SrTiO) and/or a praseodymium calcium manganese oxide (PCMO: PrCaMnO).

In various implementations, the variable resistance element may include a phase change material. The phase change material may include a chalcogenide material such as germanium-antimony-tellurium (GST: GeSbTe). The variable resistance element switches between different resistance states by changing a material state of the phase change material in either a crystal state or an amorphous state by changing the temperature, e.g., via a control of the heating or cooling of the variable resistance element.

The variable resistance element may include two magnetic layers and a tunnel barrier layer interposed between the two magnetic layers. One of the magnetic layers may include nickel-ferrum-cobalt (NiFeCo) or Cobalt-ferrum (CoFe), etc. The tunnel barrier layer may include aluminum oxide $Al_2O_3$. The variable resistance element may switch between two different resistance states corresponding to different relative magnetization directions of the two magnetic layers with respect to each other. For example, the variable resistance element may be in a low resistance state when magnetization directions of the two magnetic layers are parallel along the same direction, and the variable resistance element may be in a high resistance state when the magnetization directions of the two magnetic layers are anti-parallel with respect to each other.

Figure 1:
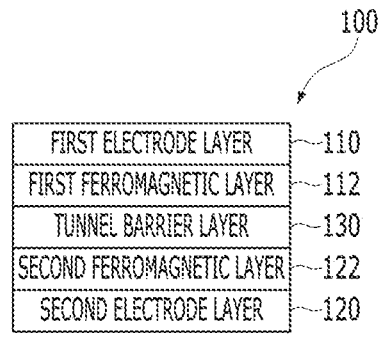
FIG. 1 is a diagram showing an example of a magnetic tunnel junction (MTJ) as one of structures having a tunnel barrier layer interposed between two ferromagnetic layers.

FIG. 1 is a diagram showing an example of a magnetic tunnel junction (MTJ) as one of structures having a tunnel barrier layer interposed between two ferromagnetic layers.

As shown in FIG. 1, an MTJ 100 includes a first electrode layer 110 as a top electrode, a second electrode layer 120 as a bottom electrode, a first ferromagnetic layer 112 and a second ferromagnetic layer 122 as a pair of ferromagnetic layers, and a tunnel barrier layer 130 which is formed between the pair of ferromagnetic layers 112 and 122.

The first ferromagnetic layer 112 may be or include a free ferromagnetic layer of which magnetization direction may be changed depending on the direction of the current applied to the MTJ 100, and the second ferromagnetic layer 122 may be or include a pinned ferromagnetic layer of which magnetization direction is pinned to a fixed direction.

Such an MTJ 100 is changed in its resistance value depending on the direction of the current, and records data "0" or "1" based on a magnetic state determined by two relative magnetization directions of the two layers 112 and 122.

Figure 2A:
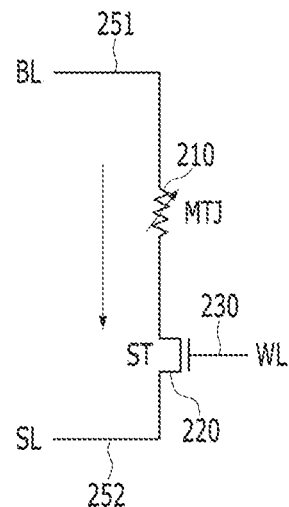
FIGS. 2A and 2B are views explaining a principle of storing data in a variable resistance element 210.
Figure 2B:
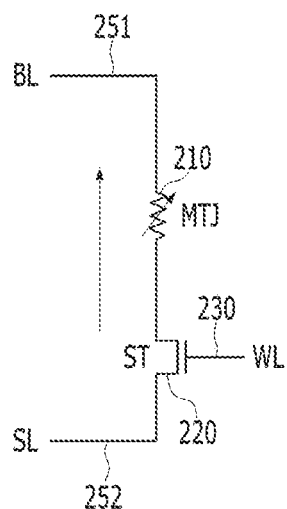

FIGS. 2A and 2B are views explaining a principle of storing data in a variable resistance element 210. The variable resistance element 210 may be or include the MTJ 100 described above with reference to FIG. 1.

FIG. 2A is a diagram explaining a principle of recording data with a low logic value in the variable resistance element 210. In order to select the variable resistance element 210 to store data, a word line 230 electrically coupled to the variable resistance element 210 is activated as a switching transistor ST, and a transistor 220 is turned on. This can be achieved by turning on the transistor 220 coupled to the variable resistance element 210 under an applied voltage at the word line 230 coupled to the gate of the transistor 220 in the example shown in FIG. 2A. Once the transistor 220 is turned on, a current can be directed to flow from one end 251 toward the other end 252 (in the direction indicated by the arrow), that is, from the first electrode layer 110 as the top electrode of the MTJ 100 shown in FIG. 1 to the second electrode layer 120 as the bottom electrode, the magnetization direction of the first ferromagnetic layer 112 as the free ferromagnetic layer and the magnetization direction of the second ferromagnetic layer 122 as the pinned ferromagnetic layer become parallel to each other, and the variable resistance element 210 has a low resistance state. When the variable resistance element 210 is the low resistance state, it is defined that 'low' data is stored in the variable resistance element 210.

FIG. 2B is a diagram explaining a principle of recording data with a high logic value in the variable resistance element 210. In a similar manner, the word line 230 coupled to the transistor 220 which is electrically coupled to the variable resistance element 210 is activated, and the transistor 220 is turned on. As a current flows from the other end 252 toward one end 251 (in the direction indicated by the arrow), that is, from the second electrode layer 120 to the first electrode layer 110, the magnetization direction of the first ferromagnetic layer 112 and the magnetization direction of the second ferromagnetic layer 122 become anti-parallel to each other, and the variable resistance element 210 has a high resistance state. When the variable resistance element 210 is the high resistance state, it is defined that 'high' data is stored in the variable resistance element 210.

The logic value of the data stored in the variable resistance element 210 is changed depending on the resistance value of the variable resistance element 210. In the case where the difference between the resistance values of the high resistance state and the low resistance state of the variable resistance element 210 is great, it is easy to determine the data stored in the variable resistance element 210. In the case where the difference between the resistance values of the high resistance state and the low resistance state of the variable resistance element 210 is small, it is difficult to discriminate different resistance states and thus to determine the data stored in the variable resistance element 210, and thus, the probability of an error to occur in discriminating data increases. Therefore, it is desirable to develop a technology capable of precisely discriminating the data stored in a variable resistance element even when the difference between the resistance values of the high resistance state and the low resistance state of the variable resistance element is small.

FIGS. 3, 4, 5, 13, 14 and 15 illustrate embodiments of memory circuits (devices) which have variable resistance elements as described above.

Figure 3:
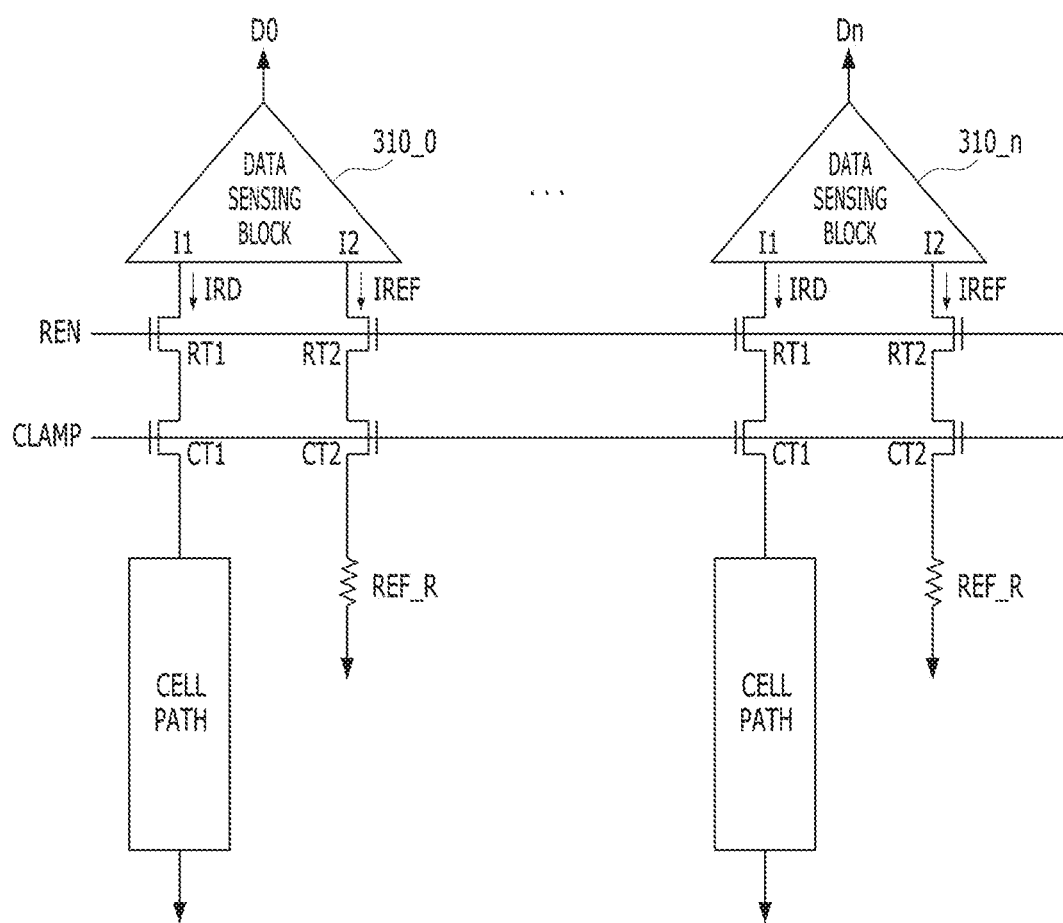
FIG. 3 is a configuration diagram illustrating a representation of an example of a memory circuit (device) including variable resistance elements.

FIG. 3 is a configuration diagram illustrating a representation of an example of a memory circuit (device) including variable resistance elements.

Referring to FIG. 3, the memory circuit (device) may include a plurality of data sensing blocks 310_0 to 310_$n$ (n is a natural number), a plurality of read enable transistors RT1 and RT2, a plurality of clamp transistors CT1 and CT2, and a plurality of reference resistance elements REF_R.

Each of the plurality of data sensing blocks 310_0 to 310_$n$ may include first and second input terminals I1 and I2. The first input terminal I1 may be coupled with a cell path CELL PATH through the read enable transistor RT1 and the clamp transistor CT1, and the second input terminal I2 may be coupled with the reference resistance element REF_R through the read enable transistor RT2 and the clamp transistor CT2.

The read enable transistors RT1 and RT2 may be turned on when a read enable signal REN which is activated in a read operation period is activated, and be turned off when the read enable signal REN is deactivated. The clamp transistors CT1 and CT2 may be turned on when a clamp signal CLAMP is activated, and be turned off when the clamp signal CLAMP is deactivated. Depending on the voltage level of the clamp signal CLAMP, the amounts of currents flowing through the first and second input terminals I1 and I2 may be adjusted.

The cell path CELL PATH may be or include a path which is coupled with a resistive storage cell selected among a plurality of resistive storage cells (not shown in FIG. 3). In a read operation, a read current IRD may flow through the first input terminal I1 and the cell path CELL PATH.

The reference resistance element REF_R may have a resistance value serving as a reference for sensing the data of the selected resistive storage cell. In the read operation, a reference current IREF may flow between the second input terminal I2 and the reference resistance element REF_R.

In the read operation, the data sensing blocks 310_0 to 310_$n$ may compare the currents IRD and IREF flowing respectively through the first and second input terminals I1 and I2 to determine data. The data sensing blocks 310_0 to 310_$n$ may amplify the data determined and output the data as outputs D0 to Dn of selected resistive storage cells included in the cell paths CELL PATH. For example, assume that a variable resistance element has a low resistance state when data having value "0" is stored in a resistive storage cell and has a high resistance state when data having value "1" is stored in the resistive storage cell. The data sensing blocks 310_0 to 310_$n$ may provide outputs D0 to Dn with value "0" for each resistive storage cell when the current amount of the read current IRD is greater than the current amount of the reference current IREF. The data sensing blocks 310_0 to 310_$n$ may provide outputs D0 to Dn with value "1" for each resistive storage cell when the current amount of the read current IRD is smaller than the current amount of the reference current IREF.

Notably, the memory circuit (device) of FIG. 3 includes the plurality of reference resistance elements REF_R corresponding to the plurality of data sensing blocks 310_0 to 310_n, respectively. This aspect may increase the area of the memory circuit or device.

Figure 4:
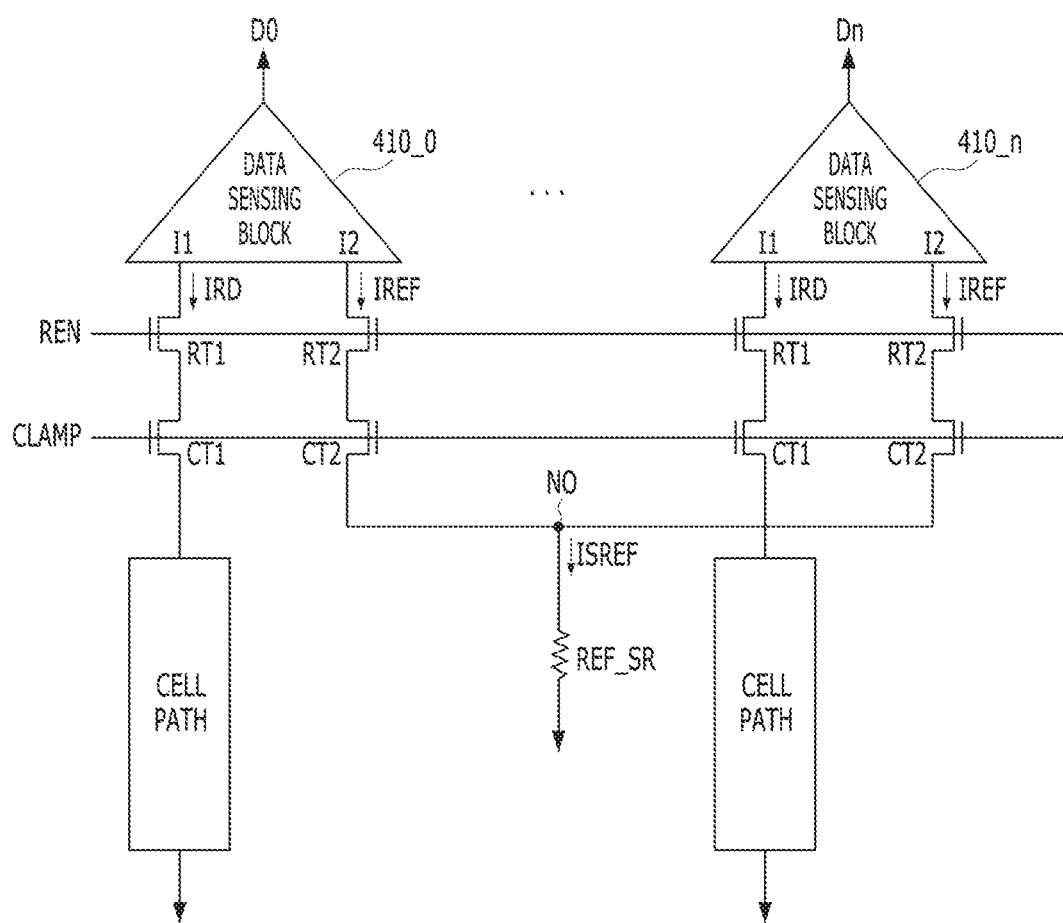
FIG. 4 is a configuration diagram illustrating a representation of an example of a memory circuit (device) including variable resistance elements.

FIG. 4 is a configuration diagram illustrating a representation of an example of a memory circuit (device) including variable resistance elements.

Referring to FIG. 4, the memory circuit (device) may include a plurality of data sensing blocks 410_0 to 410_n (n is a natural number), a plurality of read enable transistors RT1 and RT2, a plurality of clamp transistors CT1 and CT2, and a reference resistance element REF_SR.

Each of the plurality of data sensing blocks 410_0 to 410_n may include first and second input terminals I1 and I2. The first input terminal I1 may be coupled with a cell path CELL PATH through the read enable transistor RT1 and the clamp transistor CT1, and the second input terminal I2 may be coupled with the reference resistance element REF_SR through the read enable transistor RT2 and the clamp transistor CT2.

The read enable transistors RT1 and RT2 may be turned on when a read enable signal REN which is activated in a read operation period is activated, and be turned off when the read enable signal REN is deactivated. The clamp transistors CT1 and CT2 may be turned on when a clamp signal CLAMP is activated, and be turned off when the clamp signal CLAMP is deactivated. Depending on the voltage level of the clamp signal CLAMP, the amounts of currents flowing through the first and second input terminals I1 and I2 may be adjusted.

The cell path CELL PATH may be or include a path which is coupled with a resistive storage cell selected among a plurality of resistive storage cells (not shown in FIG. 4). In a read operation, a read current IRD may flow through the first input terminal I1 and the cell path CELL PATH.

The reference resistance element REF_SR may have a resistance value to serve as a reference for sensing the data of the selected resistive storage cell, and be shared by the plurality of data sensing blocks 410_0 to 410_n. In the read operation, a reference current IREF may flow between the second input terminal I2 and a node NO to which the reference resistance element REF_SR is coupled. Since a current IREF from each data sensing blocks 410_0 to 410_n flows into the node NO, the amount of a current ISREF flowing from the node NO through the reference resistance element REF_SR may be n+1 times the reference current IREF.

The data sensing blocks 410_0 to 410_n determine data stored in the respective resistive storage cells and may output data having value "0" as outputs D0 to Dn when the current amount of the read current IRD is greater than the current amount of the reference current IREF, and output data having value "1" as the outputs D0 to Dn when the current amount of the read current IRD is smaller than the current amount of the reference current IREF.

While the memory circuit (device) of FIG. 4 has an advantage that an area may be reduced because the plurality of data sensing blocks 410_0 to 410_n share the reference resistance element REF_SR, a problem may be caused in that the memory circuit (device) of FIG. 4 is vulnerable to noise because the second input terminals I2 of all the data sensing blocks 410_0 to 410_n are coupled to the node NO.

Figure 5:
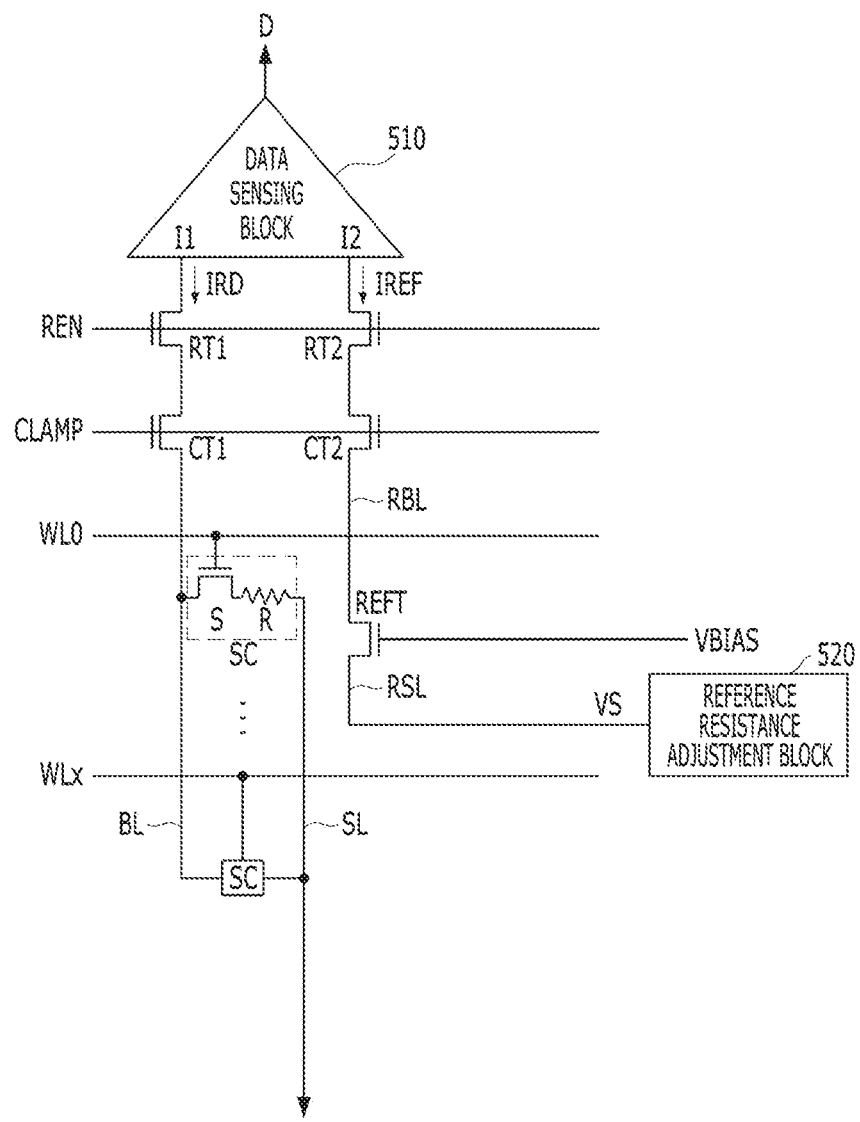
FIG. 5 is a configuration diagram illustrating a representation of an example of a memory circuit (device) including variable resistance elements.

FIG. 5 is a configuration diagram illustrating a representation of an example of a memory circuit (device) including variable resistance elements.

Referring to FIG. 5, the memory circuit (device) may include one or more resistive storage cells SC, read enable transistors RT1 and RT2, clamp transistors CT1 and CT2, a reference resistance transistor REFT, a data sensing block 510, and a reference resistance adjustment block 520.

Each of the resistive storage cells SC may include a variable resistance element R and a selection element S which is coupled in series to the variable resistance element R. The variable resistance element R may be in a low resistance state in the case where 'low' value data is stored, and be in a high resistance state in the case where 'high' value data is stored. Alternatively, the variable resistance element R may be in a low resistance state in the case where 'high' value data is stored, and be in a high resistance state in the case where 'low' value data is stored. Hereinbelow, descriptions will be made assuming that the memory circuit operates according to the former case. Selection elements S may be turned on or off in response to the voltages of a plurality of word lines WL0 to WLx (x is a natural number). For reference, for the sake of convenience in illustration, the internal configuration is illustrated for only one resistive storage cell SC. Resistive storage cells SC may be coupled between a bit line BL and a source line SL.

The read enable transistors RT1 and RT2 may be turned on when a read enable signal REN which is activated in a read operation period is activated, and be turned off when the read enable signal REN is deactivated. The clamp transistors CT1 and CT2 may be turned on when a clamp signal CLAMP is activated, and be turned off when the clamp signal CLAMP is deactivated. Depending on the voltage level of the clamp signal CLAMP, the amounts of the currents flowing through first and second input terminals I1 and I2 may be adjusted.

The reference resistance transistor REFT may have a drain which is coupled to a reference bit line RBL and a source which is coupled to a reference source line RSL. A bias voltage VBIAS may be applied to the gate of the reference resistance transistor REFT. The bias voltage VBIAS may have a fixed voltage level, and be applied only in a read operation. For example, the voltage level of the bias voltage VBIAS may be 1.5 V or 1.8 V. While FIG. 5 illustrates the case where the reference resistance transistor REFT is an NMOS transistor, it is to be noted that the reference resistance transistor REFT may be a PMOS transistor.

The data sensing block 510 may include the first and second input terminals I1 and I2. The first input terminal I1 may be coupled with the bit line BL through the read enable transistor RT1 and the clamp transistor CT1. The second input terminal I2 may be coupled with the reference bit line RBL through the read enable transistor RT2 and the clamp transistor CT2. In the read operation, the read enable signal REN and the clamp signal CLAMP may be activated, and the read enable transistors RT1 and RT2 and the clamp transistors CT1 and CT2 may be turned on. Accordingly, the first input terminal I1 and the bit line BL may be electrically coupled, and the second input terminal I2 and the reference bit line RBL may be electrically coupled.

In the read operation, a read current IRD may flow through the first input terminal I1, the read enable transistor RT1, the clamp transistor CT1, the bit line BL, a selected resistive storage cell SC (for example, a resistive storage cell SC corresponding to the word line WL0, and the source line SL. Moreover, a reference current IREF may flow through the second input terminal I2, the read enable transistor RT2, the clamp transistor CT2, the reference bit line RBL, the reference resistance transistor REFT, and the reference source line RSL.

The current amount of the read current IRD may be determined depending on the resistance value of the selected resistive storage cell SC, and the current amount of the reference current IREF may be determined depending on the resistance value of the reference resistance transistor REFT. The data sensing block 510 may compare the current amounts of the read current IRD and the reference current IREF, and output data having value "0" as an output D when the current amount of the read current IRD is greater than the current amount of the reference current IREF and output data having value "1" as the output D when the current amount of the read current IRD is smaller than the current amount of the reference current IREF.

The resistance value of the reference resistance transistor REFT may be adjusted by using a source voltage VS which is applied to the source of the reference resistance transistor REFT through the reference source line RSL. The reference resistance adjustment block 520 may generate the source voltage VS, apply the source voltage VS to the reference source line RSL, and adjust the voltage level of the source voltage VS depending on the operating condition of the memory circuit (device).

The reference resistance adjustment block 520 may adjust the voltage level of the source voltage VS depending on a temperature. The reference voltage adjustment block 520 may increase the voltage level of the source voltage VS when a temperature falls, and decrease the voltage level of the source voltage VS when a temperature rises. The relation between the voltage level of the source voltage VS with temperature will be further explained in relation to FIGS. 6 and 7. In the case of adjusting the resistance value of the reference resistance transistor REFT by adjusting the source voltage VS, the resistance value of the reference resistance transistor REFT may be adjusted finely or precisely with a smaller voltage change than the case of adjusting the resistance value of the reference resistance transistor REFT by adjusting the bias voltage VBIAS.

A current amount $I_{DS}$ flowing through the reference resistance transistor REFT may be expressed as in the following equation.

$$I_{DS} = \mu \cdot C_{ox} \cdot (W/L) \cdot [(V_{GS} - V_T) \cdot V_{DS} - (1/2) \cdot V_{DS}^2]$$

In the above equation, when removing the term $(1/2) \cdot V_{DS}^2$ through approximation, a resistance value R_REF of the reference resistance transistor REFT may be expressed as in the following equation.

$$R\_REF \approx L / \{\mu \cdot C_{ox} \cdot W \cdot (V_{GS} - V_T) \cdot V_{DS}\}$$

In the above equation, the variables indicate the following. $\mu$: mobility, $C_{ox}$: capacitance value of a gate oxide, L: length of a gate, W: width of the gate, $V_T$: threshold voltage of a transistor, $V_{GS}$: gate-source voltage of the transistor, and $V_{DS}$: drain-source voltage of the transistor.

In the above equation, the resistance value R_REF of the reference resistance transistor REFT is relevant to the gate-source voltage $V_{GS}$ and the drain-source voltage $V_{DS}$. In the case where the voltage of the gate of the reference resistance transistor REFT is changed, only the gate-source voltage $V_{GS}$ is changed. However, in the case where the voltage of the source of the reference resistance transistor REFT is changed, both the gate-source voltage $V_{GS}$ and the drain-source voltage $V_{DS}$ are changed. Therefore, changing the voltage of the source may affect more to the resistance value R_REF of the reference resistance transistor REFT than changing the voltage of the gate. Thus, in the case of adjusting the source voltage, a greater resistance change may be caused than the case of adjusting the gate voltage. Also, by adjusting the source voltage instead of the gate voltage, a range for a voltage adjustment can be reduced. Hence, it is possible to obtain a greater resistance change of the resistance value R_REF with a smaller change of the source voltage of the reference resistance transistor REFT.

Figure 6:
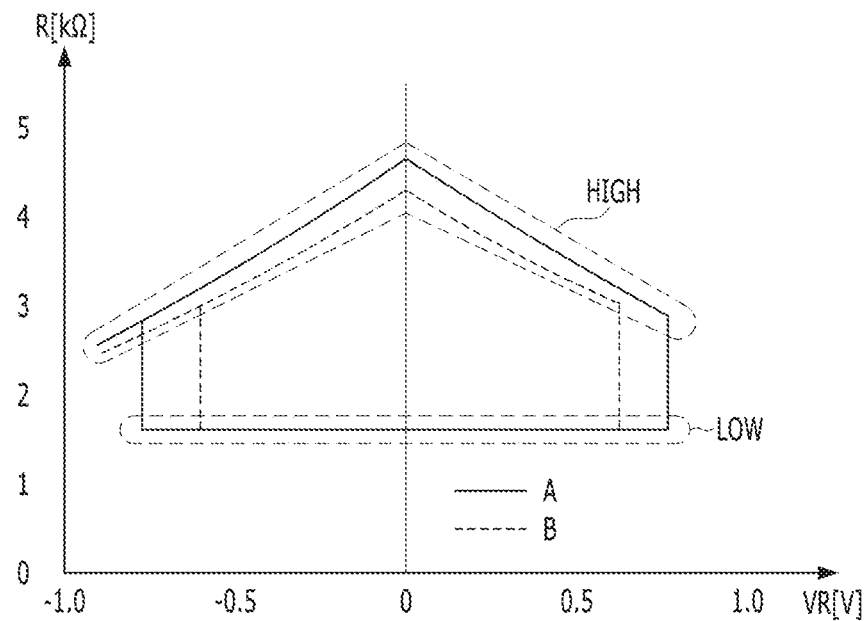
FIG. 6 is a representation of an example of a graph showing changes in the resistance value of a variable resistance element R depending on the state of the variable resistance element R and the voltage applied to both ends of the variable resistance element R.

FIG. 6 is a representation of an example of a graph to explain changes in the resistance value of the variable resistance element R depending on the state of the variable resistance element R and the voltage applied to both ends of the variable resistance element R.

Referring to FIG. 6, the solid line A represents the resistance value change of the variable resistance element R depending on the voltage applied to both ends of the variable resistance element R (hereinafter, referred to as a both-end voltage VR) in the case where a temperature is a room temperature (for example, 25° C.), and the dotted line B represents the resistance value change of the variable resistance element R depending on the both-end voltage VR in the case where a temperature is a high temperature (for example, 90° C.). Also, a 'LOW' region represents the resistance value change of the variable resistance element R depending on the both-end voltage VR in the case where the variable resistance element R is in a low resistance state, and a 'HIGH' region represents the resistance value change of the variable resistance element R depending on the both-end voltage VR in the case where the variable resistance element R is in a high resistance state.

As shown in FIG. 6, in the case where the variable resistance element R is in the low resistance state LOW, the resistance value of the variable resistance element R may be maintained to have a substantially constant value. However, in the case where the variable resistance element R is in the high resistance state HIGH, the resistance value of the variable resistance element R may be changed depending on not only a temperature but also the voltage level of the both-end voltage VR. For reference, the unit of the resistance value of the variable resistance element R is kΩ, and the unit of the both-end voltage VR is V.

Figure 7:
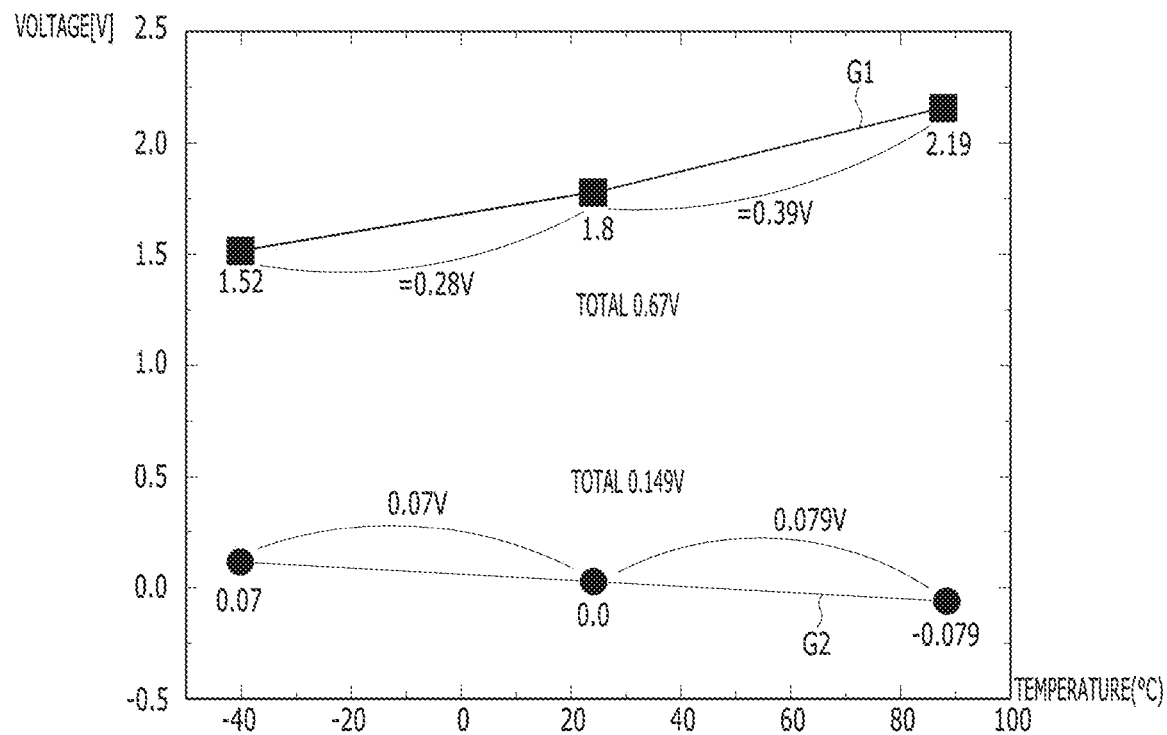
FIG. 7 is a representation of an example of a graph showing a voltage needed to retain constantly the resistance value of a reference resistance transistor REFT regardless of temperature.

FIG. 7 is a representation of an example of a graph showing a voltage needed to keep the resistance value of the reference resistance transistor REFT as constant regardless of temperature. In FIG. 7, it is assumed that temperature changes between −40° C. to 90° C.

Referring to FIG. 7, the line 'G1' represents the case where the resistance value of the reference resistance transistor REFT remains constant by changing the bias voltage VBIAS while the source voltage VS is fixed (to, for example, 0 V), and the line 'G2' represents the case where the resistance value of the reference resistance transistor REFT remains constant by changing the source voltage VS while the bias voltage VBIAS is fixed (to, for example, 1.8 V). That is to say, the voltage to be adjusted on the line 'G1' may be the bias voltage VBIAS applied to the gate of the reference resistance transistor REFT, and the voltage to be adjusted on the line 'G2' may be the source voltage VS applied to the source of the reference resistance transistor REFT.

In the case of the line 'G1,' there are three points indicated, where the reference resistance transistor REFT has the same resistance value. Three points at −40° C., 25° C., and 90° C. show that the reference resistance transistor REFT has the bias voltage VBIAS of 1.52V, 1.8V, and 2.19V, respectively. In order to keep the resistance value of the reference resistance transistor REFT as constant regardless of temperature, the voltage level of the bias voltage VBIAS should be adjusted by as much as 0.67 V from minimum 1.52 V to maximum 2.19 V. The voltage level of the bias voltage VBIAS to be adjusted depends on a temperature. Further, the relationship between the voltage level of the bias voltage VBIAS to be adjusted and a temperature change is not leaner. In FIG. 7, the bias voltage VBIAS needs to be adjusted by as much as 0.28 V in the temperature range of −40° C. to 25° C., while the bias voltage VBIAS needs to be adjusted by as much as 0.39 V in the temperature range of 25° C. to 90° C. The slope of the line G1 becomes different in two conditions that are below the room temperature and above the room temperature and thus, the voltage levels of the bias voltage VBIAS to be adjusted are substantially different around the room temperature.

In the case of the line 'G2,' there are three points indicated where the reference resistance transistor REFT has the same resistance value. Three points at −40° C., 25° C., and 90° C. show that the reference resistance transistor REFT has the source voltage VS of 0.07V, 0V, and −0.079V, respectively. In order to keep the resistance value of the reference resistance transistor REFT as constant regardless of temperature, the voltage level of the source voltage VS should be adjusted by as much as 0.149 V from minimum −0.079 V to maximum 0.7 V depending on a temperature. Thus, the voltage level of the source voltage VS to be adjusted is smaller than the case of the line 'G1.' Further, since the source voltage VS should be adjusted by 0.07 V in the temperature range of −40° C. to 25° C. and be adjusted by 0.079 V in the temperature range of 25° C. to 90° C., the voltage levels of the source voltage VS to be adjusted around the room temperature are substantially similar between two conditions that are below the room temperature and above the room temperature. As a consequence, the relationship between the voltage level of the source voltage VS to be adjusted and a temperature change is substantially linear.

From the graphs G1 and G2 shown in FIG. 7, it is noted that, the resistance value of the reference resistance transistor REFT may be significantly easily and precisely adjusted depending on a temperature by adjusting the voltage level of the source voltage VS instead of the voltage level of the bias voltage VBIAS.

The memory circuit (device) of FIG. 5 uses the reference resistance transistor REFT as a reference resistance element serving as a reference for determining the resistance value of the variable resistance element R. In this regard, since the resistance value of the reference resistance transistor REFT is adjusted by using not the bias voltage VBIAS applied to the gate but the source voltage VS applied to the source, the range of the source voltage VS to be adjusted depending on an operating temperature can be reduced, and a data sensing error may be suppressed when performing a read operation in the memory circuit (device).

Figure 8:
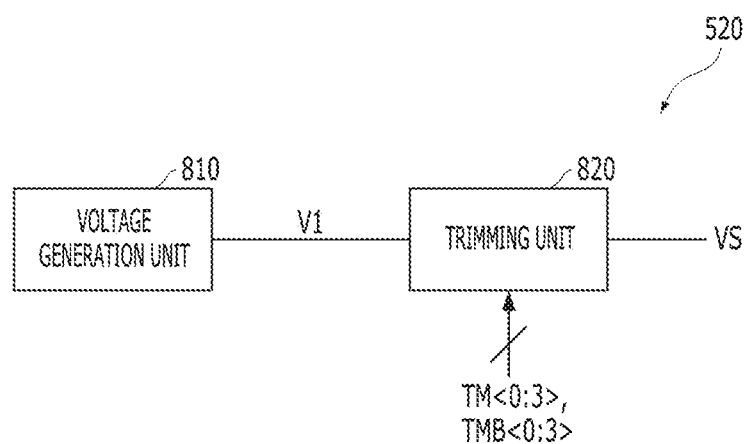
FIG. 8 is a configuration diagram illustrating a representation of an example of a reference resistance adjustment block 520 in accordance with an embodiment.

FIG. 8 is a configuration diagram illustrating a representation of an example of the reference resistance adjustment block 520 in accordance with an embodiment.

Referring to FIG. 8, the reference resistance adjustment block 520 may include a voltage generation unit 810 and a trimming unit 820.

Figure 9:
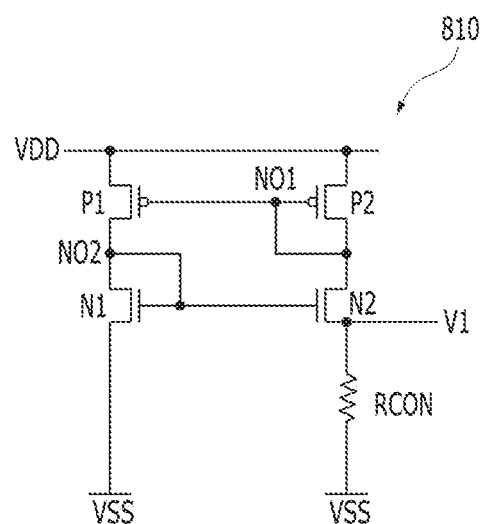
FIG. 9 is a configuration diagram illustrating a representation of an example of a voltage generation unit 810 in accordance with an embodiment.

The voltage generation unit 810 may generate a first voltage V1 of which voltage level is changed depending on a temperature. FIG. 9 is a configuration diagram illustrating a representation of an example of the voltage generation unit 810 in accordance with an embodiment. Referring to FIG. 9, the voltage generation unit 810 may include PMOS transistors P1 and P2, NMOS transistors N1 and N2, and a resistor RCON. The voltage generation unit 810 may include a Widlar circuit generally known in the art. The PMOS transistor P1 may have a source to which a power supply voltage VDD is applied, a gate which is coupled to a node NO1, and a drain which is coupled to a node NO2. The PMOS transistor P2 may have a source to which the power supply voltage VDD is applied, a gate which is coupled to the node NO1, and a drain which is coupled to the node NO1. The NMOS transistor N1 may have a source to which a ground voltage VSS is applied, a gate which is coupled to the node NO2, and a drain which is coupled to the node NO2. The NMOS transistor N2 may have a source which is coupled to the resistor RCON, a gate which is coupled to the node NO2, and a drain which is coupled to the node NO1. The first voltage V1 as the output of the voltage generation unit 810 may be the both-end voltage of the resistor RCON.

When the width/length ratios of the gates of the transistors N1, N2, P1 and P2 are (W/L)_N1, (W/L)_N2, (W/L)_P1 and (W/L)_P2, respectively, the first voltage V1 may be generated with a desired voltage level depending on a temperature by adjusting the resistance value of the resistor RCON and the values of (W/L)_N1, (W/L)_N2, (W/L)_P1 and (W/L)_P2.

Figure 10:
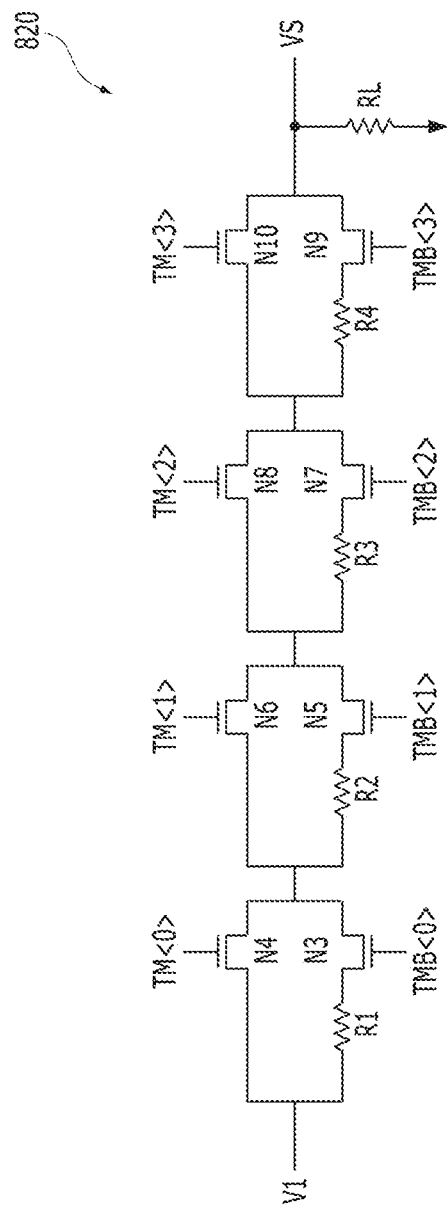
FIG. 10 is a configuration diagram illustrating a representation of an example of a trimming unit 820 in accordance with an embodiment.

The trimming unit 820 may generate the source voltage VS by dividing the first voltage V1 with an appropriate division ratio depending on the values of adjustment codes TM<0:3> and TMB<0:3>. FIG. 10 is a configuration diagram illustrating a representation of an example of the trimming unit 820 in accordance with an embodiment. Referring to FIG. 10, the trimming unit 820 may include a plurality of transistors N3 to N10 and resistors R1 to R4 and RL. The transistors N3 to N10 may be turned on or off in response to the adjustment codes TM<0:3> and TMB<0:3>, respectively. The adjustment codes TMB<0> to TMB<3> may be signals which are obtained by inverting the logic values of the adjustment codes TM<0> to TM<3>.

[Table 1] shows ratios between the source voltage VS and the first voltage V1, VS/V1, depending on the values of the adjustment codes TM<0:3> and TMB<0:3>. Values in [ ] show ratios between the source voltage VS and the first voltage V1, VS/V1, in the case where the resistance values of the resistors R1 to R4 are Ra, 2*Ra, 4*Ra and 8*Ra, respectively.

TABLE 1

| TM<3>-TM<0> | TMB<3>-TMB<0> | VS/V1 |
|---|---|---|
| 0000 | 1111 | RL/(R1 + R2 + R3 + R4 + RL) |
|  |  | [RL/(15 * Ra + RL)] |
| 0001 | 1110 | RL/(R2 + R3 + R4 + RL) |
|  |  | [RL/(14 * Ra + RL)] |
| 0010 | 1101 | RL/(R1 + R3 + R4 + RL) |
|  |  | [RL/(13 * Ra + RL)] |
| 0011 | 1100 | RL/(R3 + R4 + RL) |
|  |  | [RL/(12 * Ra + RL)] |
| 0100 | 1011 | RL/(R1 + R2 + R4 + RL) |
|  |  | [RL/(11 * Ra + RL)] |
| 0101 | 1010 | RL/(R2 + R4 + RL) |
|  |  | [RL/(10 * Ra + RL)] |
| 0110 | 1001 | RL/(R1 + R4 + RL) |
|  |  | [RL/(9 * Ra + RL)] |
| 0111 | 1000 | RL/(R4 + RL) |
|  |  | [RL/(8 * Ra + RL)] |
| 1000 | 0111 | RL/(R2 + R3 + RL) |
|  |  | [RL/(7 * Ra + RL)] |
| 1001 | 0110 | RL/(R1 + R3 + RL) |
|  |  | [RL/(6 * Ra + RL)] |
| 1010 | 0101 | RL/(R1 + R3 + RL) |
|  |  | [RL/(5 * Ra + RL)] |

TABLE 1-continued

| TM<3>-<br>TM<0> | TMB<3>-<br>TMB<0> | VS/V1 |
|---|---|---|
| 1011 | 0100 | RL/(R3 + RL) |
|  |  | [RL/(4 * Ra + RL)] |
| 1100 | 0011 | RL/(R1 + R2 + RL) |
|  |  | [RL/(3 * Ra + RL)] |
| 1101 | 0010 | RL/(R2 + RL) |
|  |  | [RL/(2 * Ra + RL)] |
| 1110 | 0001 | RL/(R1 + RL) |
|  |  | [RL/(1 * Ra + RL)] |
| 1111 | 0000 | RL/RL |
|  |  | [RL/RL] |

As shown in [Table 1], the trimming unit 820 may generate the source voltage VS by dividing the first voltage V1 with various division ratios depending on the values of the adjustment codes TM<0:3> and TMB<0:3>.

Figure 11:
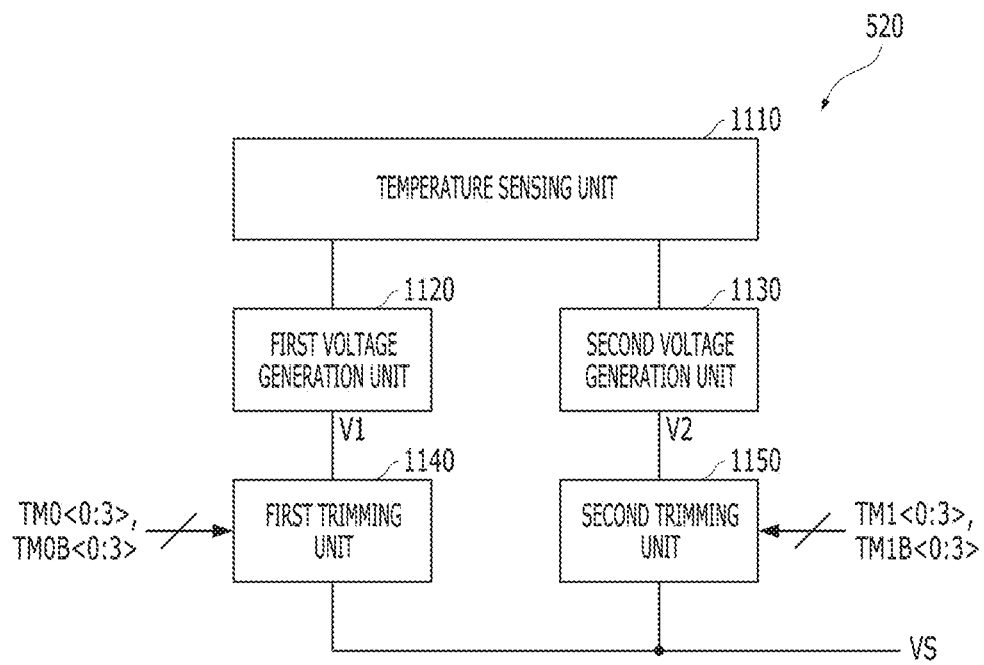
FIG. 11 is a configuration diagram illustrating a representation of an example of a reference resistance adjustment block 520 in accordance with an embodiment.

FIG. 11 is a configuration diagram illustrating a representation of an example of the reference resistance adjustment block 520 in accordance with an embodiment.

Referring to FIG. 11, the reference resistance adjustment block 520 may include a temperature sensing unit 1110, first and second voltage generation units 1120 and 1130, and first and second trimming units 1140 and 1150. The first and second voltage generation units 1120 and 1130 may have a corresponding structure to the voltage generation unit 810 in FIG. 8 and the first and second trimming units 1140 and 1150 may have a corresponding structure to the trimming unit 820 in FIG. 8.

The temperature sensing unit 1110 may sense or detect a temperature. The temperature sensing unit 1110 may activate the first voltage generation unit 1120 and deactivate the second voltage generation unit 1130 in the case where a current temperature at which the memory circuit (device) operates is equal to or higher than a reference temperature (for example, a room temperature of 25° C.). The temperature sensing unit 1110 may activate the second voltage generation unit 1130 and deactivate the first voltage generation unit 1120 in the case where the current temperature at which the memory circuit (device) operates is lower than the reference temperature.

Once activated, the first voltage generation unit 1120 may generate a first voltage V1 of which voltage level is changed depending on a temperature. The first trimming unit 1140 may generate the source voltage VS by dividing the first voltage V1 with an appropriate division ratio depending on the values of adjustment codes TM0<0:3> and TM0B<0:3>.

Once activated, the second voltage generation unit 1130 may generate a second voltage V2 of which voltage level is changed depending on a temperature. The second trimming unit 1150 may generate the source voltage VS by dividing the second voltage V2 with an appropriate division ratio depending on the values of adjustment codes TM1<0:3> and TM1B<0:3>.

In some implementations, the first and second voltage generation units 1120 and 1130 may have the same configuration as the voltage generation unit 810 of FIG. 9. However, when the width/length ratios of the gates of the transistors N1, N2, P1 and P2 are designated by (W/L)_N1, (W/L)_N2, (W/L)_P1 and (W/L)_P2, respectively, the resistance value of the resistor RCON and the values of (W/L)_N1, (W/L)_N2, (W/L)_P1 and (W/L)_P2 may have different values as needed. By adjusting the values of the width/length ratios of the gates and the resistance value of the resistor RCON, the first and second voltage generation units 1120 and 1130 may be set to have different changes of the first and second voltages V1 and V2 depending on a temperature. The first and second trimming units 1140 and 1150 may have the same configuration as the trimming unit 820 of FIG. 10.

Figure 12:
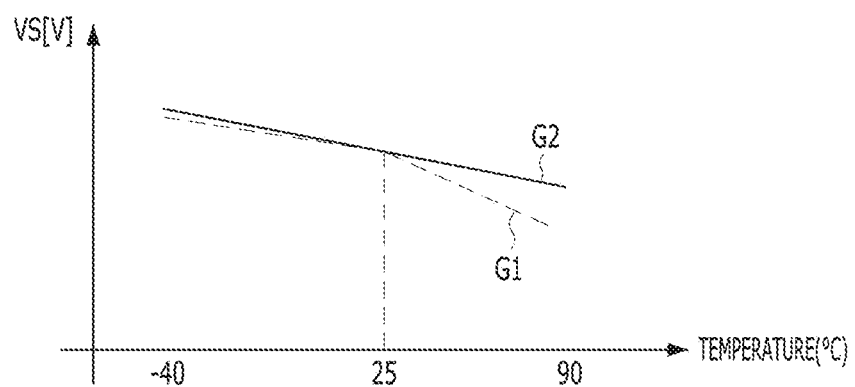
FIG. 12 are representations of examples of graphs to explain why different voltage generation units 1120 and 1130 are activated depending on a temperature in the reference resistance adjustment block 520 of FIG. 11.
Figure 12:
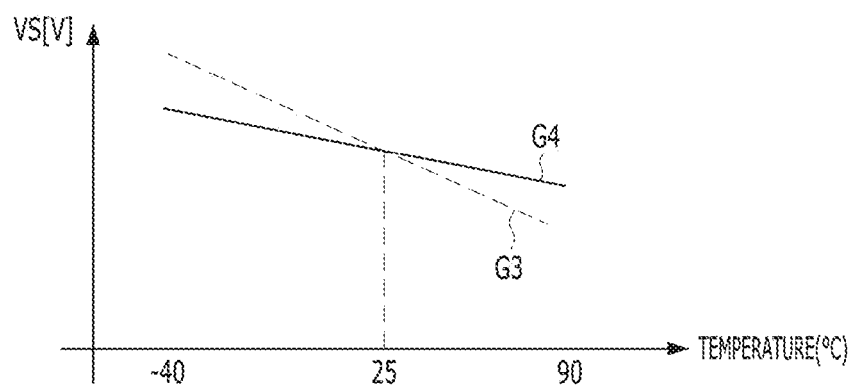

FIG. 12 is of representations of examples of graphs to explain why the different voltage generation units 1120 and 1130 are activated depending on a temperature in the reference resistance adjustment block 520 of FIG. 11.

Referring to FIG. 12, the dotted line G1 represents the source voltage VS needed in an actual case to appropriately adjust the resistance value of the reference resistance transistor REFT with a temperature change, and the solid line G2 represents the source voltage VS needed in an ideal case to appropriately adjust the resistance value of the reference resistance transistor REFT with a temperature change.

Also, the dotted line G3 represents the source voltage VS which is outputted from the first trimming unit 1140 depending on a temperature in the case where the first voltage generation unit 1120 and the first trimming unit 1140 are activated, and the solid line G4 represents the source voltage VS which is outputted from the second trimming unit 1150 depending on a temperature in the case where the second voltage generation unit 1130 and the second trimming unit 1150 are activated.

In the ideal case of the solid line G2, because the source voltage VS needed to adjust appropriately the resistance value of the reference resistance transistor REFT with a temperature change is linear, it is possible to generate an appropriate source voltage VS depending on a temperature, by using only the second voltage generation unit 1130 and the second trimming unit 1150.

In the actual case of the dotted line G1, the voltage level of the source voltage VS needed to adjust appropriately the resistance value of the reference resistance transistor REFT depending on a temperature is nonlinear (a point exists near the room temperature where the dotted line G1 is bent and the slope of the dotted line G1 is changed between before and after the point). Therefore, it is not possible to generate an appropriate source voltage VS depending on a temperature, by using only the second voltage generation unit 1130 and the second trimming unit 1150. In the actual case of the dotted line G1, in order to generate the source voltage VS having an appropriate voltage level so as to appropriately adjust the resistance value of the reference resistance transistor REFT depending on a temperature, the second voltage generation unit 1130 and the second trimming unit 1150 should be activated to generate the source voltage VS, in the case where a temperature is lower than the room temperature, and the first voltage generation unit 1120 and the first trimming unit 1140 should be activated to generate the source voltage VS, in the case where a temperature is equal to or higher than the room temperature. The source voltage VS generated from the first voltage generation unit 1120 and the first trimming unit 1140 is indicated by the graph G3 for the temperature range not less than the room temperature and the source voltage VS generated from the second voltage generation unit 1130 and the second trimming unit 1150 is indicated by the graph G4 for the temperature range less than the room temperature.

Figure 13:
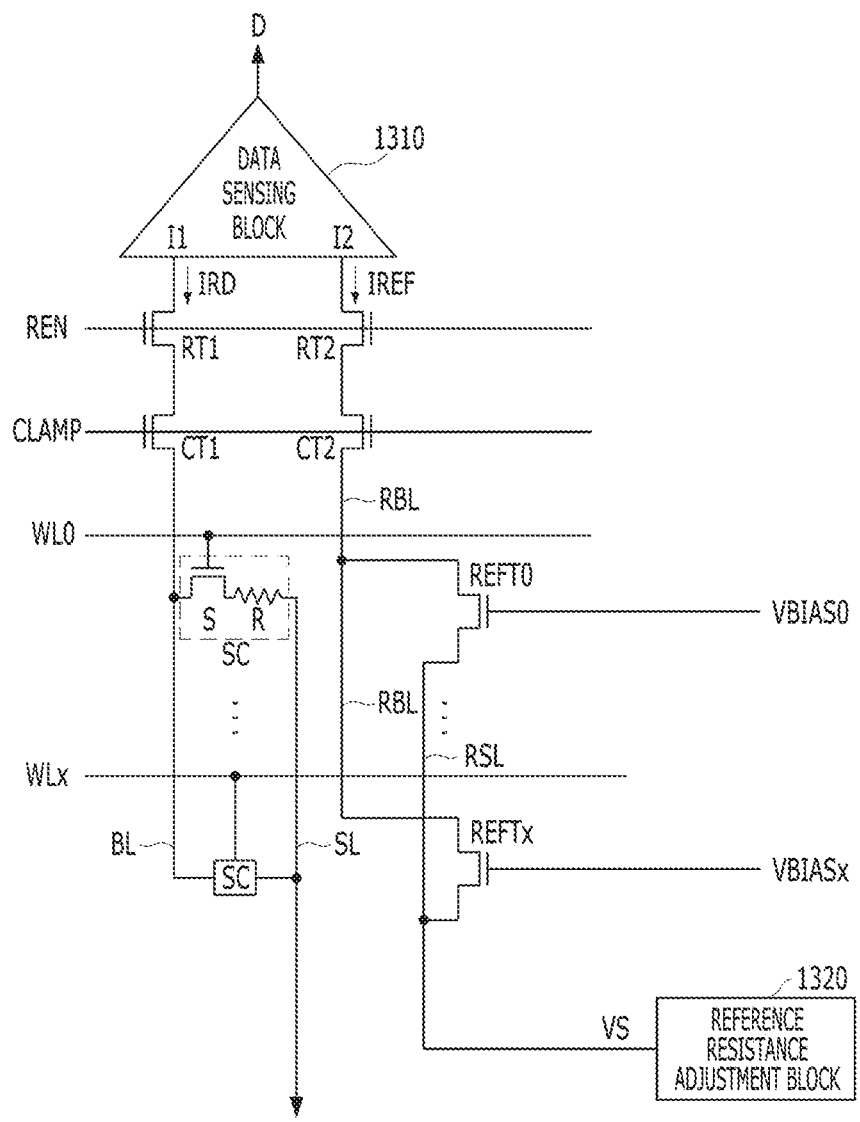
FIG. 13 is a configuration diagram illustrating a representation of an example of a memory circuit (device) including variable resistance elements.

FIG. 13 is a configuration diagram illustrating a representation of an example of a memory circuit (device) including variable resistance elements.

Referring to FIG. 13, the memory circuit (device) may include a plurality of resistive storage cells SC, read enable transistors RT1 and RT2, clamp transistors CT1 and CT2, reference resistance transistors REFT0 to REFTx, a data sensing block 1310, and a reference resistance adjustment block 1320.

The memory circuit (device) of FIG. 13 may include the plurality of reference resistance transistors REFT0 to REFTx corresponding to the resistive storage cells SC, respectively. A plurality of bias voltages VBIAS0 to VBIASx may be applied to the gates of the plurality of reference resistance transistors REFT0 to REFTx, respectively, and a corresponding bias voltage may be activated in the case where a corresponding word line is activated. For example, in the case where a word line WL0 is activated, only the bias voltage VBIAS0 among the plurality of bias voltages VBIAS0 to VBIASx may be activated.

The reference resistance adjustment block 1320 may generate a source voltage VS, and adjust the source voltage VS depending on a temperature. The reference resistance adjustment block 1320 may be designed as described above with reference to FIGS. 8 to 11.

Figure 14:
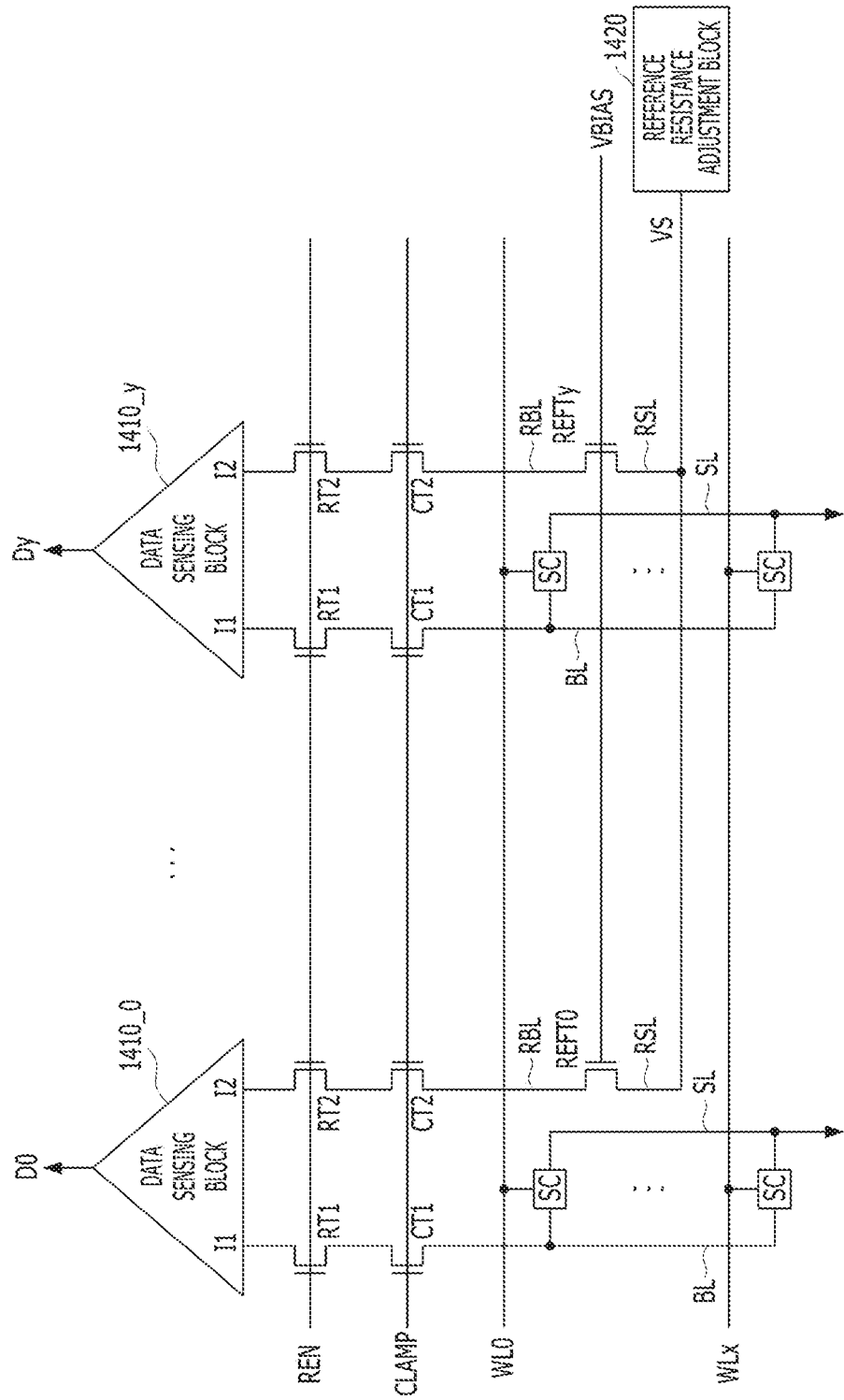
FIG. 14 is a configuration diagram illustrating a representation of an example of a memory circuit (device) including variable resistance elements.

FIG. 14 is a configuration diagram illustrating a representation of an example of a memory circuit (device) including variable resistance elements.

Referring to FIG. 14, the memory circuit (device) may include a plurality of resistive storage cells SC, read enable transistors RT1 and RT2, clamp transistors CT1 and CT2, reference resistance transistors REFT0 to REFTy, a plurality of data sensing blocks 1410_0 to 1410_y (y is a natural number), and a reference resistance adjustment block 1420.

The memory circuit (device) of FIG. 14 may include the reference resistance transistors REFT0 to REFTy corresponding to the plurality of data sensing blocks 1410_0 to 1410_y, respectively. The respective data sensing blocks 1410_0 to 1410_y may sense and output the data stored in selected resistive storage cells SC as outputs D0 to Dy.

The reference resistance adjustment block 1420 may generate a source voltage VS, and adjust the source voltage VS depending on a temperature. The reference resistance adjustment block 1420 may be designed as described above with reference to FIGS. 8 to 11.

Figure 15:
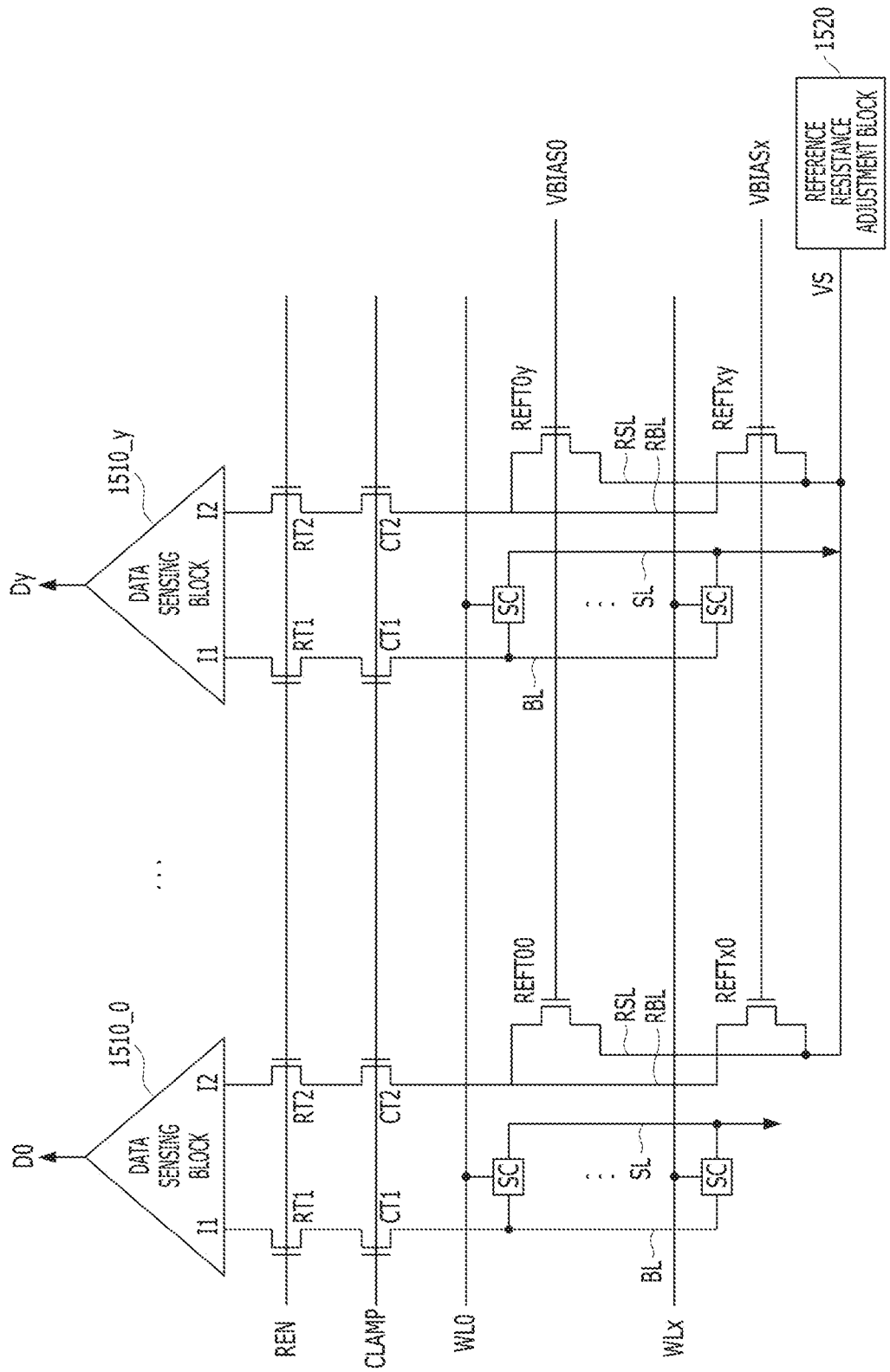
FIG. 15 is a configuration diagram illustrating a representation of an example of a memory circuit (device) including variable resistance elements.

FIG. 15 is a configuration diagram illustrating a representation of an example of a memory circuit (device) including variable resistance elements.

Referring to FIG. 15, the memory circuit (device) may include a plurality of resistive storage cells SC, read enable transistors RT1 and RT2, clamp transistors CT1 and CT2, reference resistance transistors REFT00 to REFTxy, a plurality of data sensing blocks 1510_0 to 1510_y (y is a natural number), and a reference resistance adjustment block 1520.

The memory circuit (device) of FIG. 15 may include the reference resistance transistors REFT0 to REFTxy corresponding to the plurality of data sensing blocks 1510_0 to 1510_y. The respective data sensing blocks 1510_0 to 1510_y may sense and output the data stored in selected resistive storage cells SC as outputs D0 to Dy.

The memory circuit (device) of FIG. 15 may include the plurality of reference resistance transistors REFT00 to REFTxy corresponding to the resistive storage cells SC, respectively. A plurality of bias voltages VBIAS0 to VBIASx may be applied to the gates of the plurality of reference resistance transistors REFT00 to REFTxy, and a corresponding bias voltage may be activated in the case where a corresponding word line is activated. For example, in the case where a word line WL0 is activated, only the bias voltage VBIAS0 among the plurality of bias voltages VBIAS0 to VBIASx may be activated.

The reference resistance adjustment block 1520 may generate a source voltage VS, and adjust the source voltage VS depending on a temperature. The reference resistance adjustment block 1520 may be designed as described above with reference to FIGS. 8 to 11.

According to the electronic devices according to the above-described embodiments, by adjusting the resistance value of a reference resistance transistor used as a reference resistance element by using a source voltage, it is possible to adjust precisely a reference resistance value.

Figure 16:
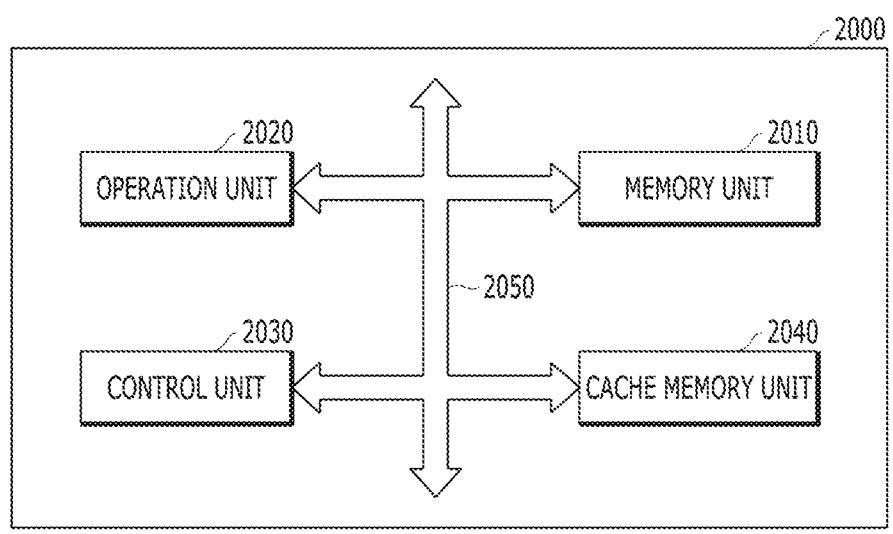
FIG. 16 is a configuration diagram illustrating an example of a microprocessor which is implemented with a memory device in accordance with an embodiment.

FIG. 16 shows an example circuit for implementing the data sensing block 510 in FIG. 5. This implementation includes circuitry 1610 that includes . . . .

The above and other memory circuits or semiconductor devices based on the disclosed technology may be used in a range of devices or systems. FIGS. 16-20 provide some examples of devices or systems that may implement the memory circuits disclosed herein.

FIG. 16 is an example of configuration diagram of a microprocessor implementing memory circuitry based on the disclosed technology.

Referring to FIG. 16, a microprocessor 2000 may perform tasks for controlling and tuning a series of processes of receiving data from various external devices, processing the data, and outputting processing results to external devices. The microprocessor 2000 may include a memory unit 2010, an operation unit 2020, a control unit 2030, and so on. The microprocessor 2000 may be various data processing units such as a central processing unit (CPU), a graphic processing unit (GPU), a digital signal processor (DSP) and an application processor (AP).

The memory unit 2010 is a part which stores data in the microprocessor 2000, as a processor register, or the like. The memory unit 2010 may include a data register, an address register, a floating point register and so on. Besides, the memory unit 2010 may include various registers. The memory unit 2010 may perform the function of temporarily storing data for which operations are to be performed by the operation unit 2020, result data of performing the operations and addresses where data for performing of the operations are stored.

The memory unit 2010 may include one or more of the above-described semiconductor devices in accordance with the implementations. For example, the memory unit 2010 may include one or more resistive storage cells each structured to exhibit different resistance values for storing data; at least one reference resistance transistor to produce a reference resistance value; a reference resistance adjustment block coupled to the at least one reference resistance transistor and structured to supply a signal to the at least one reference resistance transistor that can cause an adjustment in the resistance value of the reference resistance transistor; and a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell. Through this, characteristics of the memory unit 2010 may be improved. As a consequence, performance characteristics of the microprocessor 2000 may be improved.

The operation unit 2020 may perform four arithmetical operations or logical operations according to results that the control unit 2030 decodes commands. The operation unit 2020 may include at least one arithmetic logic unit (ALU) and so on.

The control unit 2030 may receive signals from the memory unit 2010, the operation unit 2020 and an external device of the microprocessor 2000, perform extraction, decoding of commands, and controlling input and output of signals of the microprocessor 2000, and execute processing represented by programs.

The microprocessor 2000 according to the present implementation may additionally include a cache memory unit 2040 which can temporarily store data to be inputted from an external device other than the memory unit 2010 or to be outputted to an external device. In this case, the cache memory unit 2040 may exchange data with the memory unit 2010, the operation unit 2020 and the control unit 2030 through a bus interface 2050.

Figure 17:
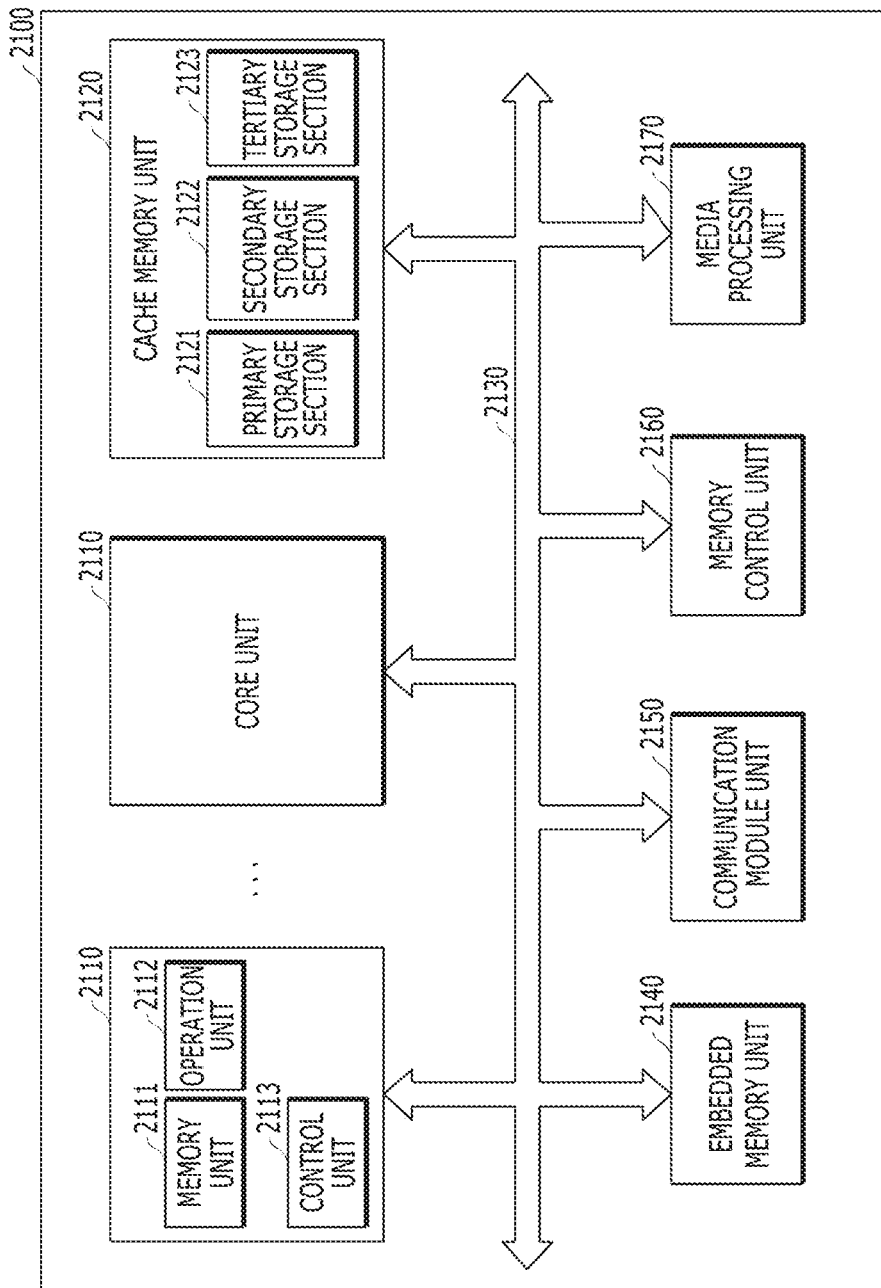
FIG. 17 is a configuration diagram illustrating an example of a processor which is implemented with a memory device in accordance with an embodiment.

FIG. 17 is an example of configuration diagram of a processor implementing memory circuitry based on the disclosed technology.

Referring to FIG. 17, a processor 2100 may improve performance and realize multi-functionality by including various functions other than those of a microprocessor which performs tasks for controlling and tuning a series of processes of receiving data from various external devices, processing the data, and outputting processing results to external devices. The processor 2100 may include a core unit 2110 which serves as the microprocessor, a cache memory unit 2120 which serves to storing data temporarily, and a bus interface 2130 for transferring data between internal and external devices. The processor 2100 may include various system-on-chips (SoCs) such as a multi-core processor, a graphic processing unit (GPU) and an application processor (AP).

The core unit 2110 of the present implementation is a part which performs arithmetic logic operations for data inputted from an external device, and may include a memory unit 2111, an operation unit 2112 and a control unit 2113.

The memory unit 2111 is a part which stores data in the processor 2100, as a processor register, a register or the like. The memory unit 2111 may include a data register, an address register, a floating point register and so on. Besides, the memory unit 2111 may include various registers. The memory unit 2111 may perform the function of temporarily storing data for which operations are to be performed by the operation unit 2112, result data of performing the operations and addresses where data for performing of the operations are stored. The operation unit 2112 is a part which performs operations in the processor 2100. The operation unit 2112 may perform four arithmetical operations, logical operations, according to results that the control unit 2113 decodes commands, or the like. The operation unit 2112 may include at least one arithmetic logic unit (ALU) and so on. The control unit 2113 may receive signals from the memory unit 2111, the operation unit 2112 and an external device of the processor 2100, perform extraction, decoding of commands, controlling input and output of signals of processor 2100, and execute processing represented by programs.

The cache memory unit 2120 is a part which temporarily stores data to compensate for a difference in data processing speed between the core unit 2110 operating at a high speed and an external device operating at a low speed. The cache memory unit 2120 may include a primary storage section 2121, a secondary storage section 2122 and a tertiary storage section 2123. In general, the cache memory unit 2120 includes the primary and secondary storage sections 2121 and 2122, and may include the tertiary storage section 2123 in the case where high storage capacity is required. As the occasion demands, the cache memory unit 2120 may include an increased number of storage sections. That is to say, the number of storage sections which are included in the cache memory unit 2120 may be changed according to a design. The speeds at which the primary, secondary and tertiary storage sections 2121, 2122 and 2123 store and discriminate data may be the same or different. In the case where the speeds of the respective storage sections 2121, 2122 and 2123 are different, the speed of the primary storage section 2121 may be largest. At least one storage section of the primary storage section 2121, the secondary storage section 2122 and the tertiary storage section 2123 of the cache memory unit 2120 may include one or more of the above-described semiconductor devices in accordance with the implementations. For example, the cache memory unit 2120 may include one or more resistive storage cells each structured to exhibit different resistance values for storing data; at least one reference resistance transistor to produce a reference resistance value; a reference resistance adjustment block coupled to the at least one reference resistance transistor and structured to supply a signal to the at least one reference resistance transistor that can cause an adjustment in the resistance value of the reference resistance transistor; and a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell. Through this, characteristics of the cache memory unit 2120 may be improved. As a consequence, performance characteristics of the processor 2100 may be improved.

Although it was shown in FIG. 17 that all the primary, secondary and tertiary storage sections 2121, 2122 and 2123 are configured inside the cache memory unit 2120, it is to be noted that all the primary, secondary and tertiary storage sections 2121, 2122 and 2123 of the cache memory unit 2120 may be configured outside the core unit 2110 and may compensate for a difference in data processing speed between the core unit 2110 and the external device. Meanwhile, it is to be noted that the primary storage section 2121 of the cache memory unit 2120 may be disposed inside the core unit 2110 and the secondary storage section 2122 and the tertiary storage section 2123 may be configured outside the core unit 2110 to strengthen the function of compensating for a difference in data processing speed. In another implementation, the primary and secondary storage sections 2121, 2122 may be disposed inside the core units 2110 and tertiary storage sections 2123 may be disposed outside core units 2110.

The bus interface 2130 is a part which connects the core unit 2110, the cache memory unit 2120 and external device and allows data to be efficiently transmitted.

The processor 2100 according to the present implementation may include a plurality of core units 2110, and the plurality of core units 2110 may share the cache memory unit 2120. The plurality of core units 2110 and the cache memory unit 2120 may be directly connected or be connected through the bus interface 2130. The plurality of core units 2110 may be configured in the same way as the above-described configuration of the core unit 2110. In the case where the processor 2100 includes the plurality of core unit 2110, the primary storage section 2121 of the cache memory unit 2120 may be configured in each core unit 2110 in correspondence to the number of the plurality of core units 2110, and the secondary storage section 2122 and the tertiary storage section 2123 may be configured outside the plurality of core units 2110 in such a way as to be shared through the bus interface 2130. The processing speed of the primary storage section 2121 may be larger than the processing speeds of the secondary and tertiary storage section 2122 and 2123. In another implementation, the primary storage section 2121 and the secondary storage section 2122 may be configured in each core unit 2110 in correspondence to the number of the plurality of core units 2110, and the tertiary storage section 2123 may be configured outside the plurality of core units 2110 in such a way as to be shared through the bus interface 2130.

The processor 2100 according to the present implementation may further include an embedded memory unit 2140 which stores data, a communication module unit 2150 which can transmit and receive data to and from an external device in a wired or wireless manner, a memory control unit 2160 which drives an external memory device, and a media processing unit 2170 which processes the data processed in the processor 2100 or the data inputted from an external input device and outputs the processed data to an external interface device and so on. Besides, the processor 2100 may include a plurality of various modules and devices. In this case, the plurality of modules which are added may exchange data with the core units 2110 and the cache memory unit 2120 and with one another, through the bus interface 2130.

The embedded memory unit 2140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 2150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 2160 is to administrate and process data transmitted between the processor 2100 and an external storage device operating according to a different communication standard. The memory control unit 2160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 2170 may process the data processed in the processor 2100 or the data inputted in the forms of image, voice and others from the external input device and output the data to the external interface device. The media processing unit 2170 may include a graphic processing unit (GPU), a digital signal processor (DSP), a high definition audio device (HD audio), a high definition multimedia interface (HDMI) controller, and so on.

Figure 18:
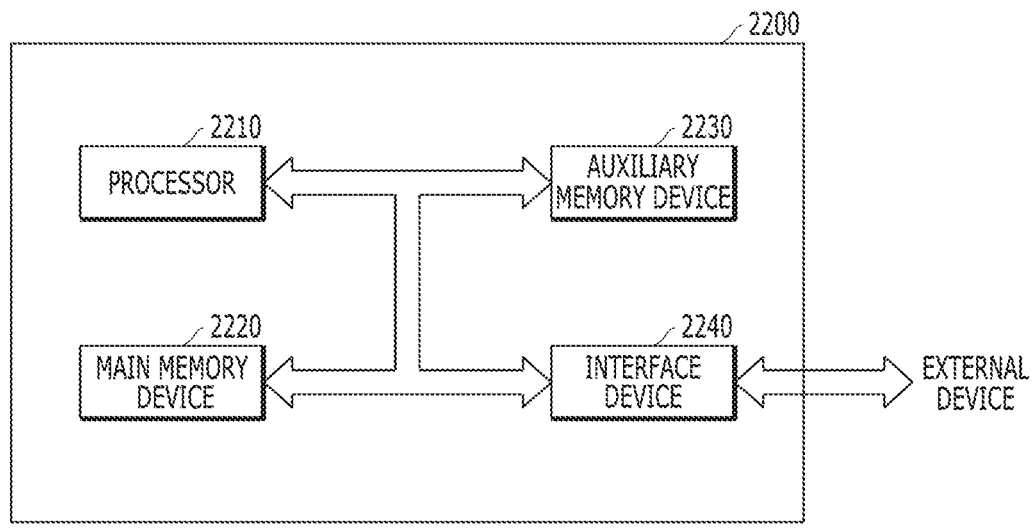
FIG. 18 is a configuration diagram illustrating an example of a system which is implemented with a memory device in accordance with an embodiment.

FIG. 18 is an example of configuration diagram of a system implementing memory circuitry based on the disclosed technology.

Referring to FIG. 18, a system 2200 as an apparatus for processing data may perform input, processing, output, communication, storage, etc. to conduct a series of manipulations for data. The system 2200 may include a processor 2210, a main memory device 2220, an auxiliary memory device 2230, an interface device 2240, and so on. The system 2200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 2210 may decode inputted commands and processes operation, comparison, etc. for the data stored in the system 2200, and controls these operations. The processor 2210 may include a microprocessor unit (MPU), a central processing unit (CPU), a single/multi-core processor, a graphic processing unit (GPU), an application processor (AP), a digital signal processor (DSP), and so on.

The main memory device 2220 is a storage which may temporarily store, call and execute program codes or data from the auxiliary memory device 2230 when programs are executed and can conserve memorized contents even when power supply is cut off. The main memory device 2220 may include one or more of the above-described semiconductor devices in accordance with the implementations. For example, the main memory device 2220 may include one or more resistive storage cells each structured to exhibit different resistance values for storing data; at least one reference resistance transistor to produce a reference resistance value; a reference resistance adjustment block coupled to the at least one reference resistance transistor and structured to supply a signal to the at least one reference resistance transistor that can cause an adjustment in the resistance value of the reference resistance transistor; and a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell. Through this, characteristics of the main memory device 2220 may be improved. As a consequence, performance characteristics of the system 2200 may be improved.

Also, the main memory device 2220 may further include a static random access memory (SRAM), a dynamic random access memory (DRAM), and so on, of a volatile memory type in which all contents are erased when power supply is cut off. Unlike this, the main memory device 2220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 2230 is a memory device for storing program codes or data. While the speed of the auxiliary memory device 2230 is slower than the main memory device 2220, the auxiliary memory device 2230 can store a larger amount of data. The auxiliary memory device 2230 may include one or more of the above-described semiconductor devices in accordance with the implementations. For example, the auxiliary memory device 2230 may include one or more resistive storage cells each structured to exhibit different resistance values for storing data; at least one reference resistance transistor to produce a reference resistance value; a reference resistance adjustment block coupled to the at least one reference resistance transistor and structured to supply a signal to the at least one reference resistance transistor that can cause an adjustment in the resistance value of the reference resistance transistor; and a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell. Through this, characteristics of the auxiliary memory device 2230 may be improved. As a consequence, performance characteristics of the system 2200 may be improved.

Also, the auxiliary memory device 2230 may further include a data storage system (see the reference numeral 2300 of FIG. 19) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 2230 may not include the semiconductor devices according to the implementations, but may include data storage systems (see the reference numeral 2300 of FIG. 19) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 2240 may be to perform exchange of commands and data between the system 2200 of the present implementation and an external device. The interface device 2240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 19:
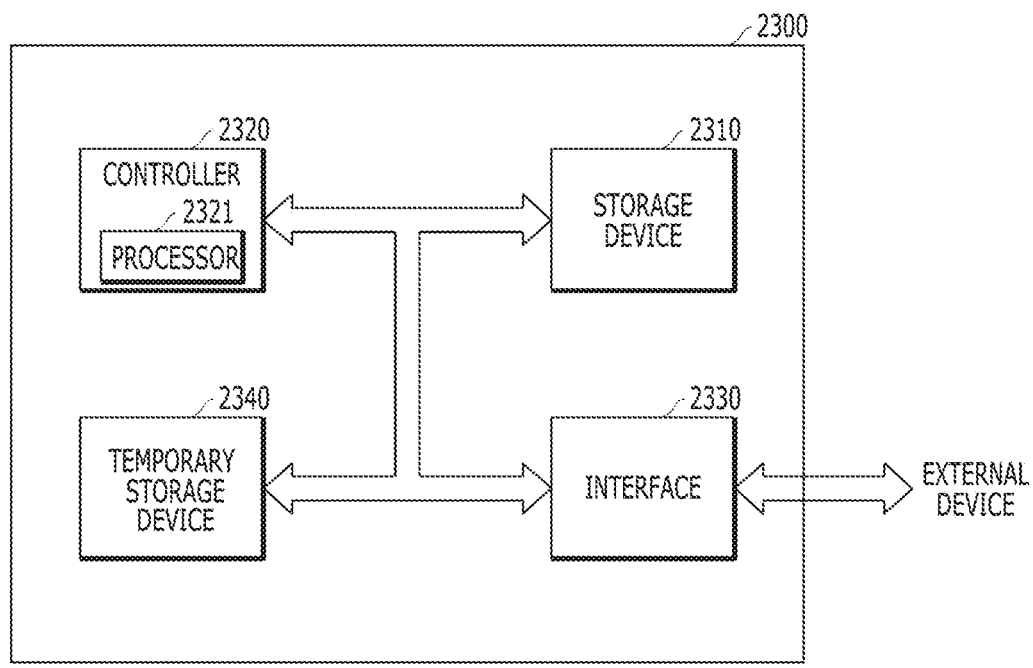
FIG. 19 is a configuration diagram illustrating an example of a data storage system which is implemented with a memory device in accordance with an embodiment.

FIG. 19 is an example of configuration diagram of a data storage system implementing memory circuitry based on the disclosed technology.

Referring to FIG. 19, a data storage system 2300 may include a storage device 2310 which has a nonvolatile characteristic as a component for storing data, a controller 2320 which controls the storage device 2310, an interface 2330 for connection with an external device, and a temporary storage device 2340 for storing data temporarily. The data storage system 2300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 2310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 2320 may control exchange of data between the storage device 2310 and the interface 2330. To this end, the controller 2320 may include a processor 2321 for performing an operation for, processing commands inputted through the interface 2330 from an outside of the data storage system 2300 and so on.

The interface 2330 is to perform exchange of commands and data between the data storage system 2300 and the external device. In the case where the data storage system 2300 is a card type, the interface 2330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 2300 is a disk type, the interface 2330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 2330 may be compatible with one or more interfaces having a different type from each other.

The temporary storage device 2340 can store data temporarily for efficiently transferring data between the interface 2330 and the storage device 2310 according to diversifications and high performance of an interface with an external device, a controller and a system. The temporary storage device 2340 for temporarily storing data may include one or more of the above-described semiconductor devices in accordance with the implementations. For example, the temporary storage device 2340 may include one or more resistive storage cells each structured to exhibit different resistance values for storing data; at least one reference resistance transistor to produce a reference resistance value; a reference resistance adjustment block coupled to the at least one reference resistance transistor and structured to supply a signal to the at least one reference resistance transistor that can cause an adjustment in the resistance value of the reference resistance transistor; and a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell. Through this, characteristics of the temporary storage device 2340 may be improved. As a consequence, performance characteristics of the system 2300 may be improved.

Figure 20:
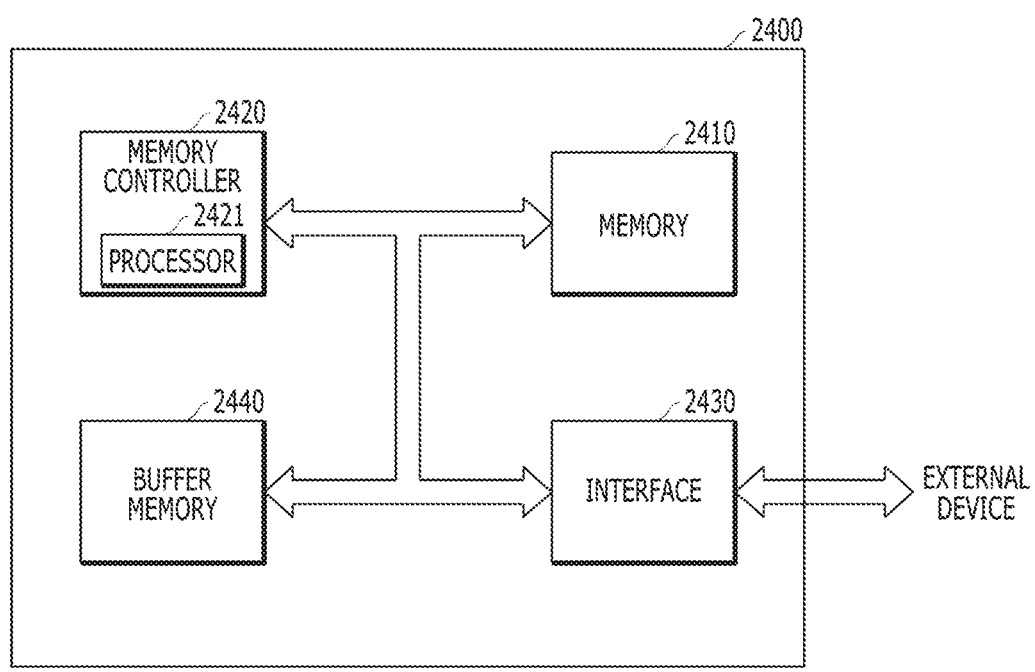
FIG. 20 is a configuration diagram illustrating an example of a memory system which is implemented with a memory device in accordance with an embodiment.

FIG. 20 is an example of configuration diagram of a memory system implementing memory circuitry based on the disclosed technology.

Referring to FIG. 20, a memory system 2400 may include a memory 2410 which has a nonvolatile characteristic as a component for storing data, a memory controller 2420 which controls the memory 2410, an interface 2430 for connection with an external device, and so on. The memory system 2400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 2410 for storing data may include one or more of the above-described semiconductor devices in accordance with the implementations. For example, the memory 2410 may include one or more resistive storage cells each structured to exhibit different resistance values for storing data; at least one reference resistance transistor to produce a reference resistance value; a reference resistance adjustment block coupled to the at least one reference resistance transistor and structured to supply a signal to the at least one reference resistance transistor that can cause an adjustment in the resistance value of the reference resistance transistor; and a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell. Through this, characteristics of the memory 2410 may be improved. As a consequence, performance characteristics of the microprocessor 2400 may be improved.

Through this, the performance of the memory system 2400 may be improved by performing a stable sense and amplification operation.

Also, the memory 2410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 2420 may control exchange of data between the memory 2410 and the interface 2430. To this end, the memory controller 2420 may include a processor 2421 for performing an operation for and processing commands inputted through the interface 2430 from an outside of the memory system 2400.

The interface 2430 is to perform exchange of commands and data between the memory system 2400 and the external device. The interface 2430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 2430 may be compatible with one or more interfaces having a different type from each other.

The memory system 2400 according to the present implementation may further include a buffer memory 2440 for efficiently transferring data between the interface 2430 and the memory 2410 according to diversification and high performance of an interface with an external device, a memory controller and a memory system. For example, the buffer memory 2440 for temporarily storing data may include one or more of the above-described semiconductor devices in accordance with the implementations. The buffer memory 2440 may include one or more resistive storage cells each structured to exhibit different resistance values for storing data; at least one reference resistance transistor to produce a reference resistance value; a reference resistance adjustment block coupled to the at least one reference resistance transistor and structured to supply a signal to the at least one reference resistance transistor that can cause an adjustment in the resistance value of the reference resistance transistor; and a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell. Through this, characteristics of the buffer memory 2440 may be improved. As a consequence, performance characteristics of the microprocessor 2400 may be improved.

Moreover, the buffer memory 2440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 2440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 16-20 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An electronic device including a semiconductor memory, the semiconductor memory comprising:
   one or more resistive storage cells each structured to exhibit different resistance values for storing data;
   at least one reference resistance transistor to produce a reference resistance value;
   a reference resistance adjustment block coupled to the at least one reference resistance transistor and structured to supply a signal to the at least one reference resistance transistor that can cause an adjustment in the resistance value of the reference resistance transistor; and
   a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell, and
   wherein a bias voltage applied to a gate of the reference resistance transistor is fixed during a read operation, and
   wherein the signal supplied by the reference resistance adjustment block includes a source voltage provided to a source of the reference resistance transistor,
   wherein the reference resistance adjustment block is structured to adjust the source voltage depending on a temperature and comprises:
   a voltage generation unit structured to generate a temperature-dependent voltage that is adjusted depending on a temperature; and
   a trimming unit coupled to the voltage generation unit to receive the temperature-dependent voltage and operable to generate the source voltage by dividing the temperature-dependent voltage with a division ratio based on voltage adjustment codes.

2. The electronic device according to claim 1, wherein the data sensing block includes first and second input terminals and is structured to compare a read current flowing through the first input terminal and the selected resistive storage cell with a reference current flowing through the second input terminal and the reference resistance transistor.

3. An electronic device including a semiconductor memory, the semiconductor memory comprising:
   one or more resistive storage cells each structured to exhibit different resistance values for storing data;
   at least one reference resistance transistor to produce a reference resistance value;
   a reference resistance adjustment block coupled to the at least one reference resistance transistor and structured to supply a signal to the at least one reference resistance transistor that can cause an adjustment in the resistance value of the reference resistance transistor; and
   a data sensing block coupled to the one or more resistive storage cells and the at least one reference resistance transistor, the data sensing block structured to sense resistance values of a resistive storage cell selected among the one or more resistive storage cells and the at least one reference resistance transistor and to compare the sensed resistance values to determine data of the selected resistive storage cell, and
   wherein a bias voltage applied to a gate of the reference resistance transistor is fixed during a read operation, and
   wherein the signal supplied by the reference resistance adjustment block includes a source voltage provided to a source of the reference resistance transistor, wherein the reference resistance adjustment block comprises:
   a first voltage generation unit operable to generate the source voltage which is adjusted to a first slope depending on a temperature in a first temperature period;
   a second voltage generation unit operable to generate the source voltage which is adjusted to a second slope depending on a temperature in a second temperature period; and
   a temperature sensing unit coupled to the first and second voltage generation units to activate the first voltage generation unit in the first temperature period, and to activate the second voltage generation unit in the second temperature period.

4. The electronic device according to claim 1, wherein the semiconductor memory further comprises:
   first and second transistors coupled in series between the first input terminal and the one or more resistive storage cells, and operable to be turned on or off in response to a read enable signal and a clamp signal, respectively; and third and fourth transistors coupled in series between the second input terminal and the reference resistance transistor, and operable to be turned on or off in response to the read enable signal and the clamp signal, respectively.

5. The electronic device according to claim 1, wherein each resistive storage cell comprises:
   a selection element; and
   a variable resistance element structured to be operable to exhibit different resistance values that represent different data stored in the resistive storage cell.

6. The electronic device according to claim 5, wherein the variable resistance element comprises a metal oxide or a structure in which a tunnel barrier layer is interposed between two ferromagnetic layers.

7. The electronic device of claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory is part of the memory unit in the microprocessor.

8. The electronic device of claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

9. The electronic device of claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory is part of the auxiliary memory device or the main memory device in the processing system.

10. The electronic device of claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory is part of the storage device or the temporary storage device in the data storage system.

11. The electronic device of claim 1, further comprising a memory system which includes:
    a memory configured to store data and conserve stored data regardless of power supply;
    a memory controller configured to control input and output of data to and from the memory according to a command inputted form an outside;
    a buffer memory configured to buffer data exchanged between the memory and the outside; and
    an interface configured to perform communication between at least one of the memory, the memory controller and the buffer memory and the outside,
    wherein the semiconductor memory is part of the memory or the buffer memory in the memory system.

12. An electronic device including a semiconductor memory, the semiconductor memory comprising:
    a plurality of bit lines and a plurality of source lines;
    a plurality of resistive storage cells coupled between a corresponding bit line and a corresponding source line among the plurality of bit lines and the plurality of source lines;
    a plurality of reference bit lines and a plurality of reference source lines;
    a plurality of reference resistance transistors coupled between a corresponding reference bit line and a corresponding reference source line among the plurality of reference bit lines and the plurality of reference source lines;
    a plurality of data sensing blocks coupled to the plurality of reference resistance transistors and the plurality of resistive storage cells and operable to compare a read current flowing through a corresponding bit line among the plurality of bit lines with a reference current flowing through a corresponding reference bit line among the plurality of reference bit lines, and sensing data of a resistive storage cell selected among a plurality of resistive storage cells coupled to the corresponding bit line; and
    a reference resistance adjustment block coupled to the plurality of reference resistance transistors and structured to supply respective signals to the plurality of reference resistance transistors that can cause an adjustment in the resistance values of the reference resistance transistors, respectively, and
    wherein a bias voltage applied to a gate of a reference resistance transistor within the plurality of reference resistance transistors is fixed during a read operation, and
    wherein a signal supplied by the reference resistance adjustment block includes a source voltage provided to a source of a reference resistance transistor within the plurality of reference resistance transistors, wherein the reference resistance adjustment block is structured to adjust the source voltage at a reference resistance transistor depending on a temperature and comprises:

a voltage generation unit structured to generate a temperature-dependent voltage of which level is adjusted depending on a temperature; and a trimming unit coupled to the voltage generation unit to receive the temperature-dependent voltage and operable to generate the source voltage by dividing the temperature-dependent voltage with a division ratio that is based on voltage adjustment codes.

13. The electronic device according to claim 12, wherein the plurality of data sensing blocks comprise first and second input terminals, and wherein the semiconductor memory further comprises:

a plurality of first and second transistors coupled in series between the first input terminals of the data sensing blocks and the bit lines, and operable to be turned on or off in response to a read enable signal and a clamp signal, respectively; and a plurality of third and fourth transistors coupled in series between the second input terminals of the data sensing blocks and the reference bit lines, and operable to be turned on or off in response to the read enable signal and the clamp signal, respectively.

14. An electronic device including a semiconductor memory, the semiconductor memory comprising:

a plurality of bit lines and a plurality of source lines;

a plurality of resistive storage cells coupled between a corresponding bit line and a corresponding source line among the plurality of bit lines and the plurality of source lines;

a plurality of reference bit lines and a plurality of reference source lines;

a plurality of reference resistance transistors coupled between a corresponding reference bit line and a corresponding reference source line among the plurality of reference bit lines and the plurality of reference source lines;

a plurality of data sensing blocks coupled to the plurality of reference resistance transistors and the plurality of resistive storage cells and operable to compare a read current flowing through a corresponding bit line among the plurality of bit lines with a reference current flowing through a corresponding reference bit line among the plurality of reference bit lines, and sensing data of a resistive storage cell selected among a plurality of resistive storage cells coupled to the corresponding bit line; and a reference resistance adjustment block coupled to the plurality of reference resistance transistors and structured to supply respective signals to the plurality of reference resistance transistors that can cause an adjustment in the resistance values of the reference resistance transistors, respectively, and wherein a bias voltage applied to a gate of a reference resistance transistor within the plurality of reference resistance transistors is fixed during a read operation, and wherein a signal supplied by the reference resistance adjustment block includes a source voltage provided to a source of a reference resistance transistor within the plurality of reference resistance transistors, wherein the reference resistance adjustment block comprises:

a first voltage generation unit structured to generate the source voltage in a first temperature period, the source voltage adjusted based on a first relationship between a change of the source voltage and a temperature;

a second voltage generation unit structured to generate the source voltage in a second temperature period, the source voltage adjusted based on a second relationship between a change of the source voltage and a temperature; and a temperature sensing unit coupled to the first and second voltage generation units to activate the first voltage generation unit in the first temperature period, and to activate the second voltage generation unit in the second temperature period.

15. The electronic device according to claim 12, wherein each resistive storage cell comprises:

a selection element; and a variable resistance element structured to be operable to exhibit different resistance values that represent different data stored in the resistive storage cell.

16. The electronic device according to claim 12, wherein the variable resistance element comprises a metal oxide or a structure in which a tunnel barrier layer is interposed between two ferromagnetic layers.

17. An electronic device including a semiconductor memory, the semiconductor memory comprising:

a storage cell including a variable resistance element structured to exhibit different resistance states of different resistance values for representing different data for data storage;

a data sensing block coupled to the storage cell and including a first terminal and a second terminal, the data sensing block structured to compare a first current flowing through the first terminal with a second current flowing through the second terminal and provide an output data based the comparison; and a reference resistance transistor coupled to the second terminal of the data sensing block and structured to receive a temperature-dependent source voltage that is based on an operating temperature of the semiconductor memory, and wherein a bias voltage applied to a gate of the reference resistance transistor is fixed during a read operation, and wherein the source voltage is provided to a source of the reference resistance transistor, wherein the reference resistance adjustment block includes:

a voltage generation unit for structured to generate a temperature-dependent voltage that is adjusted depending on a temperature; and a trimming unit coupled to the voltage generation unit to receive the temperature-dependent voltage and operable to generate the source voltage.

18. The electronic device of claim 17, further comprising:

a reference resistance adjustment block coupled to the reference resistance transistor and structured to provide the source voltage to the reference resistance transistor.

19. The electronic device of claim 17, wherein the reference resistance transistor has a constant resistance value not susceptible to temperature change.

20. The electronic device of claim 17, wherein the variable resistance element comprises a metal oxide or a structure in which a tunnel barrier layer is interposed between two ferromagnetic layers.

* * * * *